(12) United States Patent
Sakai et al.

(10) Patent No.: US 6,265,743 B1
(45) Date of Patent: *Jul. 24, 2001

(54) TRENCH TYPE ELEMENT ISOLATION STRUCTURE

(75) Inventors: Maiko Sakai; Takashi Kuroi; Katsuyuki Horita, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/963,764

(22) Filed: Nov. 4, 1997

(30) Foreign Application Priority Data

Apr. 11, 1997 (JP) .................................................. 9-093600
Jul. 17, 1997 (JP) .................................................. 9-192269

(51) Int. Cl.[7] ........................ H01L 27/108; H01L 29/76; H01L 29/94; H01L 31/119
(52) U.S. Cl. ...................... 257/305; 257/374; 257/396; 257/397; 257/513; 438/207; 438/221; 438/225
(58) Field of Search ........................ 257/510, 513, 257/296, 305, 395, 396, 397, 398, 374; 438/207, 221, 225

(56) References Cited

U.S. PATENT DOCUMENTS

| 4,471,525 | * | 9/1984 | Sasaki | 29/576 W |
|---|---|---|---|---|
| 4,656,497 | * | 4/1987 | Rogers et al. | 357/50 |
| 4,740,480 | * | 4/1988 | Ooka | 437/61 |
| 5,059,550 | * | 10/1991 | Tateoka et al. | 437/67 |
| 5,373,180 | * | 12/1994 | Hillenius et al. | 257/357 |
| 5,581,110 | * | 12/1996 | Razouk et al. | 257/513 |

FOREIGN PATENT DOCUMENTS

| 0 660 389 A2 | 6/1995 | (EP) . |
|---|---|---|
| 64-69027 | 3/1989 | (JP) . |
| 1-222457 | 9/1989 | (JP) . |
| 7-254638 | 10/1995 | (JP) . |
| 7-335737 | 12/1995 | (JP) . |
| 9-8118 | 1/1997 | (JP) . |

OTHER PUBLICATIONS

A Highly Manufacturable Trench Isolation Process for Deep Submicron DRAMs by Pierre C. Fazan et al., IEDM Tech. Dig., pp. 57–60 (1993).*

* cited by examiner

Primary Examiner—William Mintel
(74) Attorney, Agent, or Firm—McDermott, Will & Emery

(57) ABSTRACT

There is provided a trench type element isolation structure wherein no recess develops in the edge part of an imbedded oxide film of a trench type element isolation. Thermal oxidation films having higher etching resistance than a CVD film are formed not only on the surroundings of the imbedded oxide film inside the groove formed on the silicon substrate but also on the lateral sides of the imbedded oxide film projecting upward from the silicon substrate surface.

4 Claims, 15 Drawing Sheets

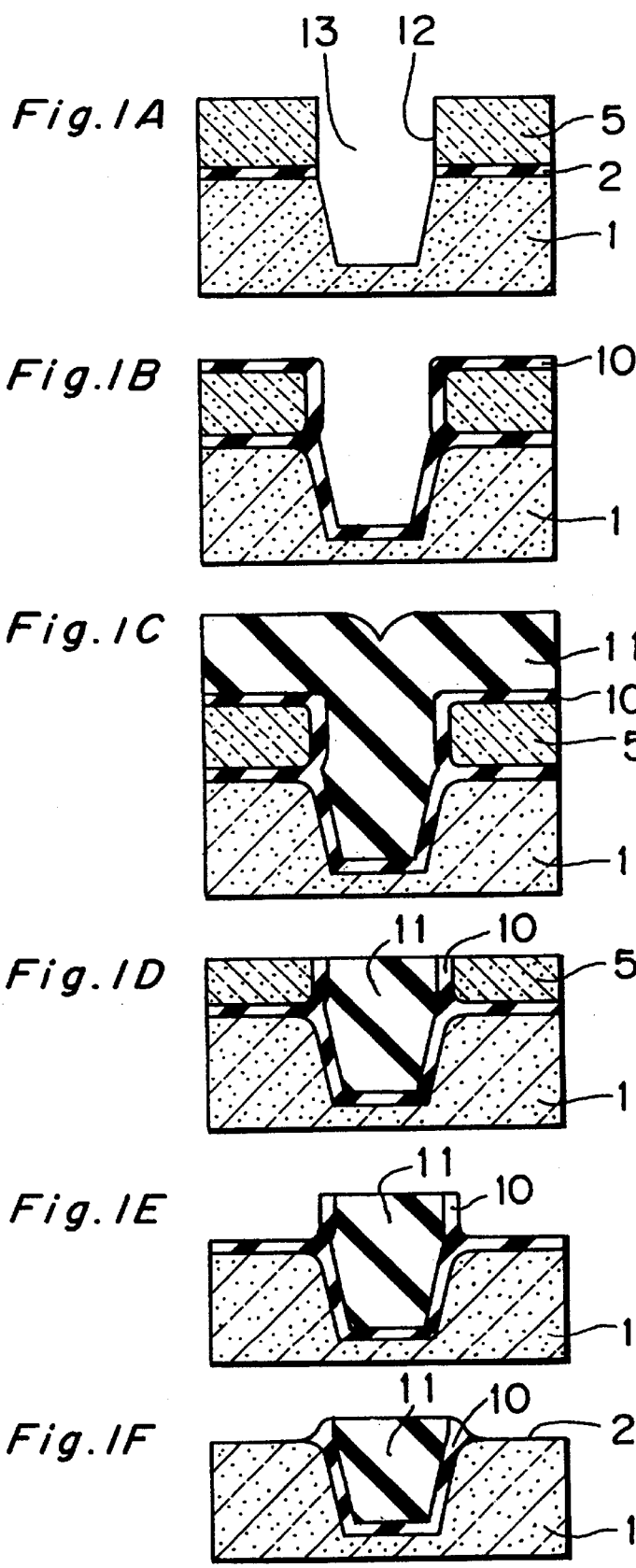

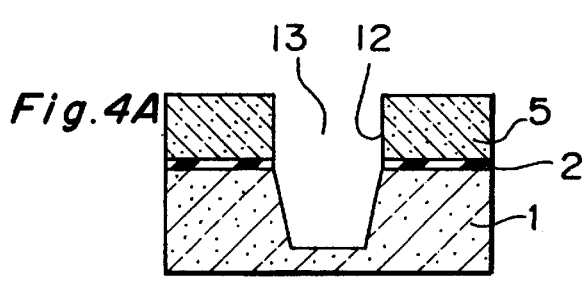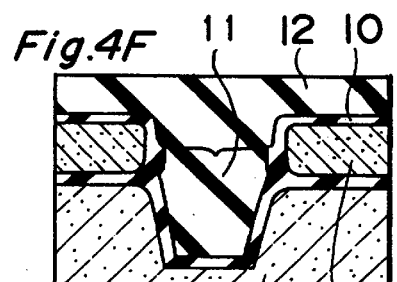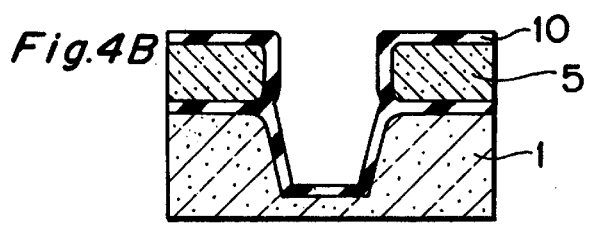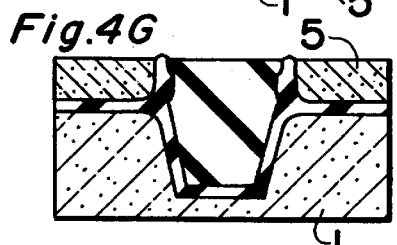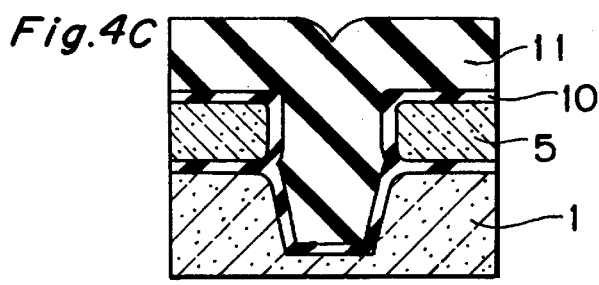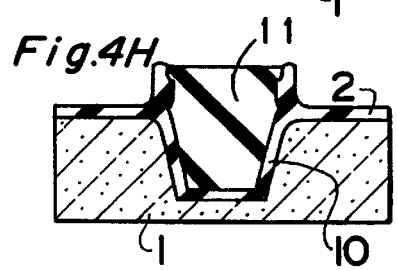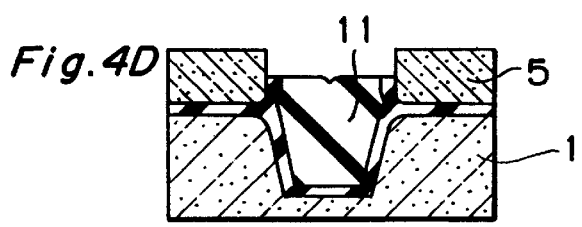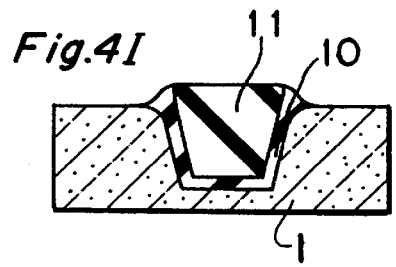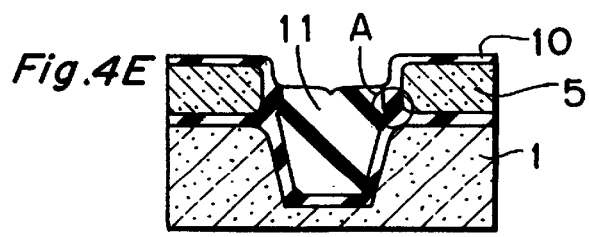

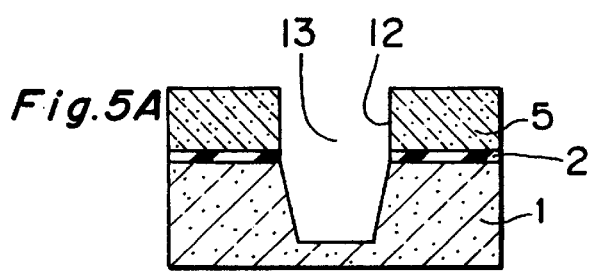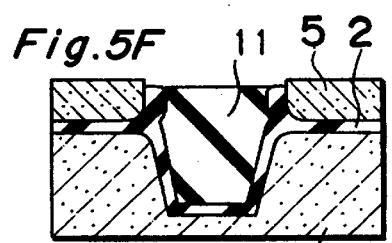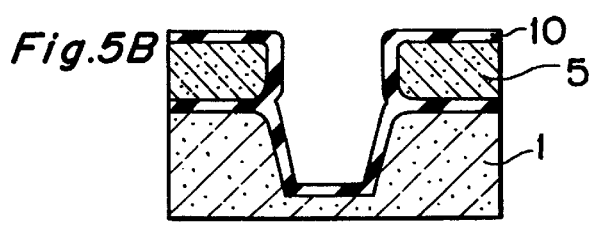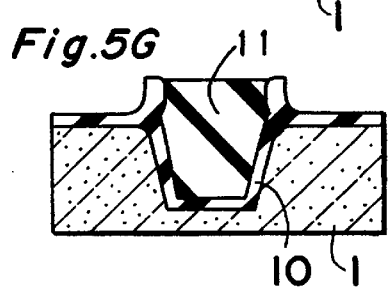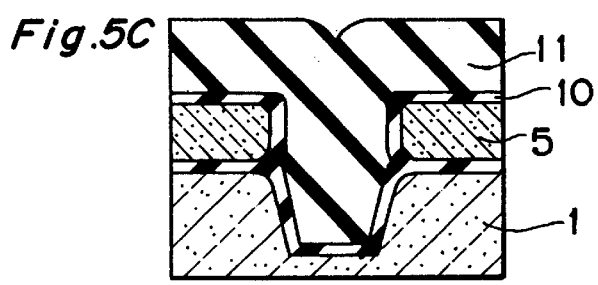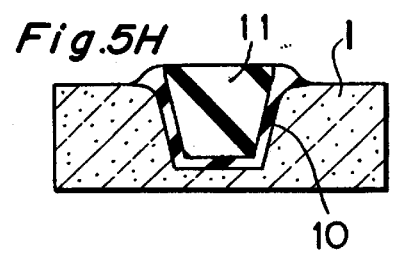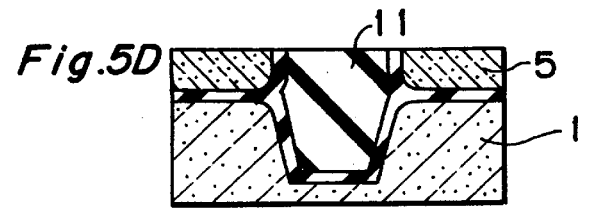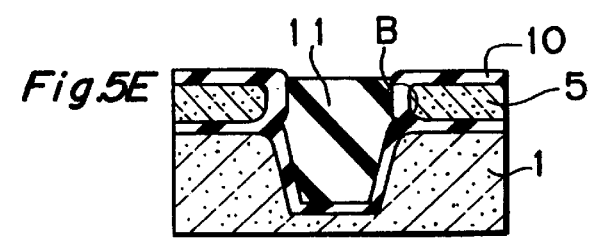

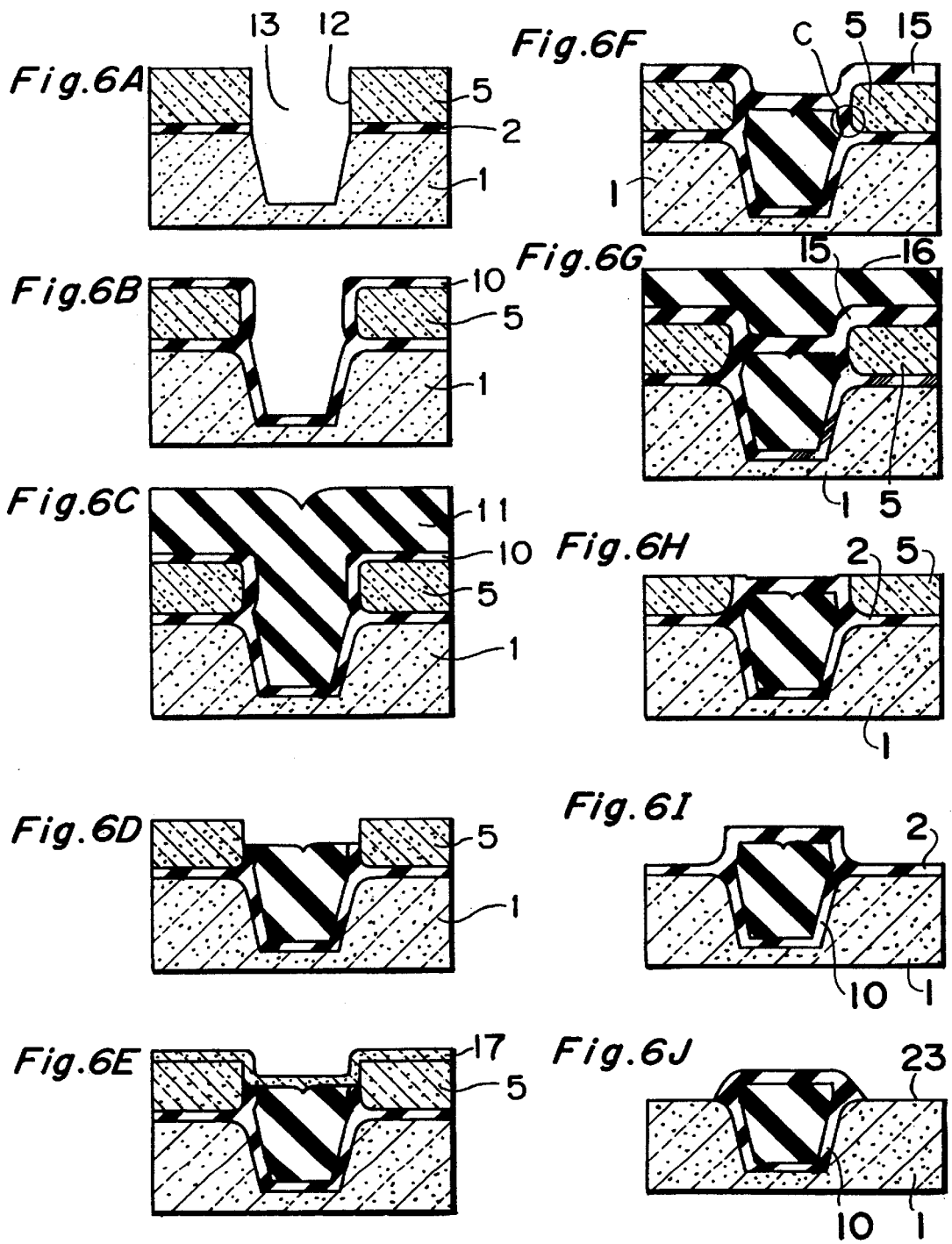

TRENCH TYPE ELEMENT ISOLATION STRUCTURE

BACKGROUND OF THE INVENTION

1. Field of the Invention

The present invention relates to a method for forming a trench type element isolation structure to be used for a semiconductor integrated circuit and trench type element isolation structure.

2. Description of the Prior Art

In a semiconductor integrated circuit, in order to eliminate electric interference between the elements in operation and control each element in fully independent state, elements are isolated from one another. Especially, a trench type element isolation structure is a trench filled with an insulator and, as a bird's beak does not occur, it is an indispensable element isolation structure for making the semiconductor integrated circuit into miniature size.

FIGS. 13A–13F are sectional views of a method of forming a conventional trench type element isolation structure. First, as shown in FIG. 13A, an under-layer oxide film (first thermal oxidation film) 2 and a silicon nitride film 3 are sequentially deposited on a silicon substrate 1, after which, with a photolithographic pattern (not illustrated) used as a mask, silicon nitride film 3 and under-layer oxide film 2 are sequentially patterned to form a groove in silicon substrate 1.

Next, as shown in FIG. 13B, a thermal oxidation film 10 is formed on an inner wall of the groove by thermal oxidation, after which an imbedding oxide film 11 is laid over the whole surface by CVD step.

Next, as shown in FIG. 13C, the imbedded oxide film 11 formed on the upper part of the nitride film 3 by a CMP step using a silicon nitride film 3 as a stopper is eliminated to allow the imbedded oxide film 11 to remain only in the groove.

Next, as shown in FIG. 13D, the silicon nitride film 3 is eliminated by heated phosphoric acid, after which the CVD oxide film 20 is accumulated on the whole surface by CVD step.

Next, as shown in FIG. 13E, a CVD oxide film 20' is allowed to remain only on the side wall of the imbedded oxide film 11 by carrying out anisotropic etching.

Finally, as shown in FIG. 13F, by eliminating the under-layer oxide film 2 with hydrofluoric acid, a trench type element isolation structure is completed.

In a method of forming a trench type element isolation structure, it is essential to remove ultimately the under-laid oxide film 2 formed on the activated region 23. However, in the conventional structure trench type element isolation structure, the CVD oxide film 20' is formed by CVD and the etching speed in hydrofluoric acid is larger than that of the thermal oxidation film therefore, in removing under-laid oxide film 2 shown in FIG. 13F, the CVD oxide film 20' is also etched and, hence, fails to perform the function as protective film for the oxide film 11 imbedded in the groove. Thus, the imbedded oxide film 11 in the groove is also etched in the edge part, resulting in formation of a recess 21 on the edge part of the imbedded oxide film in the groove.

In an integrated circuit, as shown in FIG. 16, there may be a case where a gate electrode 22 is formed on said trench type element isolation to take a structure to control the transistor formed on the activated region 23 by said gate electrode 22. In such a case, due to the existence of the recess 21, the gate electrode 22 does not become smooth shape on the edge part of the trench but concentration of an electric field occurs, which may be a cause for the reverse narrow channel effect to show lowering of the threshold value of the transistor. Especially, as the integration of the semiconductor elements progresses and the width of the activated region 23 (gap between the adjacent trenches) becomes narrower, the effect of the reverse narrow channel effect becomes remarkable, thereby making it extremely difficult to control the threshold voltage of the transistor to give ill effect on the circuit operation.

Accordingly, the present invention has its object to provide a method for forming a trench type element isolation structure which is free from formation of recess in an edge part of a trench type element isolation imbedded oxide film.

SUMMARY OF THE INVENTION

In view of the above, the present inventors made strenuous study, and as a result found out that, by forming a thermal oxidation film having higher etching resistance than the CVD film not only on the surrounding of the imbedded oxide film inside the groove formed on the silicon substrate but also on the lateral side of the imbedded oxide film projecting upward from the silicon substrate, formation of recess on the edge part of the imbedded oxide film in the step of removing the first thermal oxidation film can be prevented, and the reverse narrow channel effect of the transistor wherein a gate electrode is formed on a trench type element isolation structure can be suppressed, and completed the present invention.

According to the present invention, there is provided a method for forming a trench type element isolation structure wherein an imbedded oxide film projecting upward from the silicon substrate surface is imbedded in a groove formed on a silicon substrate through a thermal oxidation film, comprising: a) a step of forming a non-single crystal silicon film on said silicon substrate through a first thermal oxidation film, b) a step of forming a groove extending from the surface of said non-single crystal silicon film to the inside of said silicon substrate, c) a thermal oxidation step for forming second and third thermal oxidation films on the inside surface of said groove including said groove wall and said lateral side wall of said non-single crystal silicon film, and d) a removing step for removing said non-single crystal silicon film excluding said third thermal oxidation film to have said third thermal oxidation film formed on the lateral side projecting upward from the surface of said silicon substrate of said imbedded oxide film.

According to such a method, because the surroundings of the imbedded oxide film, not only the silicon substrate surface inside the groove but also the lateral side of the upward projecting part from the silicon substrate surface, are surrounded by the thermal oxidation film having the higher etching resistance than the CVD oxide film, such thermal oxidation film is less liable to be etched in the etching step of the first thermal oxidation film.

That is to say, in the conventional method, the CVD oxide film formed on the surroundings of the imbedded oxide film projecting upward from the silicon substrate surface showed formation of recess at the edge part of the imbedded oxide film inside the groove, by being simultaneously etched in the etching step of the first thermal oxidation film. To the contrary, according to the present invention method, on the lateral side of the imbedded oxide film projecting upward from the silicon substrate surface is provided with a thermal oxidation film having higher etching resistance than the CVD oxide film, so that the film is less liable to be etched in the etching step of said first thermal oxidation film, the lateral side of the imbedded oxide film is protected, and it becomes possible to prevent formation of recess in the edge part of the imbedded oxide film.

Thus, in the transistor having a gate electrode formed on a trench type element isolation structure, because of no formation of recess on the imbedded oxide film inside the isolation groove, concentration of electric fields in the gate electrode formed on the imbedded oxide film as in the conventional instance can be prevented, and it becomes possible to suppress the reverse narrow channel effect of transistor.

The present invention also provides a method for forming a trench type element isolation structure which comprises, further between said thermal oxidation step and said removing step, a deposition step for depositing said imbedded oxide film inside said groove and on said non-single crystal silicon film, and a film-thinning step for reducing the film thickness from the upper surface of the imbedded oxide film until the non-single crystal silicon film is exposed, characterized by forming said third thermal oxidation film on the projecting side wall projecting upward from the surface of the silicon substrate.

Especially, according to the present forming method, unlike the conventional method, a step of removing the film by dry etching is not included, and it becomes possible to prevent occurrence of damage in the substrate.

The present invention is also a method for forming a trench type element isolation structure which comprises, a step for forming silicon nitride films on said non-single crystal silicon films on both sides of said groove, and further comprises, in said film-thinning step, a step of removing said silicon nitride film after reducing the film thickness of said imbedded oxide film with said silicon nitride film used as a stopper and leaving said imbedded oxide film only inside the groove.

According to such a forming method, in the etching step of the first thermal oxidation film, in addition to it being possible to prevent formation of recess in the edge part of the imbedded oxide film in the trench, due to the use of a silicone nitride film which has a large etching selectivity to the silicon oxide film as a stopper in the film thinning step, it is possible to control the height of the imbedded oxide film from the substrate surface in good precision and to reduce irregularity of the heights of the imbedded oxide film.

The present invention is also a method for forming a trench type element isolation structure which comprises, further between the deposition step and the film-thinning step, a step for removing said imbedded oxide film, the thermal oxidation film on the upper surface of said non-single crystal silicon film, and said third thermal oxidation film, from the upper part to the predetermined position underneath the upper surface of the non-single crystal silicon film, and a step for depositing the upper-layer imbedded oxide film on said groove inside and said non-single crystal silicon film.

According to such forming method, in the etching step of the first thermal oxide film, in addition to it being possible to prevent formation of recess in the edge part of the imbedded oxide film in the trench, in the deposition step, in case of formation of a seam in the imbedded oxide film, the imbedded oxide film is eliminated until such seam is exposed from the upper part, and the upper layer imbedded oxide film is deposited so as to bury such seam, by which it becomes possible to form a seamless element isolation structure.

As a result, in case of forming an electrode on the trench type element isolation, short-circuiting of electrode attributed to said seam is prevented, and improvement of yield in manufacture of the integrated circuit can be expected.

The present invention is also a method for forming a trench type element isolation structure which comprises, further between the deposition step and the film-thinning step, a step for removing said imbedded oxide film, the thermal oxidation film on the upper surface of said non-single crystal silicon film, and said third thermal oxidation film, from the upper part to the predetermined position between the upper surface and the bottom surface of the non-single crystal silicon film, to expose a side surface of at least a part of said non-single crystal silicon film, a step for thickening the tip parts of the third thermal oxidation films on both sides of said imbedded oxide film by thermally oxidizing the exposed side and the upper surface of said non-single crystal silicon film, and a step of depositing the upper layer imbedded oxide film on the whole surface after thickening the tip part of said third thermal oxidation film.

According to such forming method, the third thermal oxidation film of the part A of the side wall part shown in FIG. 4E can be formed thicker than the other thermal oxidation film, and in the etching step of the first thermal oxidation film, the third thermal oxidation film on the A part is less easily etched, so that the formation of recess on the edge part of the imbedded oxide film can be more effectively prevented.

Since the thickness of the third thermal oxidation film on the part A may be individually formed thick without thickening the film thickness of the second thermal oxidation film in inside of other trench groove, even in case of using the forming method of the present invention, the film thickness of the second thermal oxidation film in the trench groove does not become thick, and there is no generation of seam due to the increase in the aspect ratio.

Further, the present invention is also a method for forming a trench type element isolation structure which comprises, further between said film-thinning step and said removing step, a step for thickening the upper end part of said third thermal oxidation film by thermal oxidation of the exposed upper surface of said non-single crystal silicon film, and a step for removing the thermal oxidation film on the upper surface of said non-single crystal silicon film, after thickening the upper end part of said third thermal oxidation film.

According to such forming method, the third thermal oxidation film of the part B shown in FIG. 5E can be formed thicker than the other thermal oxidation film, and in the etching step of the first thermal oxidation film, the third thermal oxidation film on the part B is less easily etched, so that the formation of recess on the edge part of the imbedded oxide film can be more effectively prevented.

The present invention is also a method for forming a trench type element isolation structure which comprises, further between the deposition step and the film thinning-step, a step for removing said imbedded oxide film, the thermal oxidation film on the upper surface on said non-single crystal silicon film and said third thermal oxidation film from the upper part to the predetermined position between the upper surface and the bottom surface of the non-single crystal silicon film, to expose a side surface and the upper surface of the non-single crystal silicon film, a step for depositing the non-single crystal silicon film for thermal oxidation on the whole surface, a step for thermal oxidation of said non-single crystal silicon film for thermal oxidation, and a step for depositing the upper layer imbedded oxide film on the whole surface.

According to such forming method, a thermal oxidation film having high etching resistance can be formed on the upper part in addition to the side wall of the imbedded oxide film in the groove. In other words, because the imbedded oxide film inside the groove is surrounded by the third thermal oxidation film even on the upper surface, so that the formation of recess on the edge part of the imbedded oxide film in the etching step of the first thermal oxidation film can be perfectly prevented.

Further, as it is possible to form the third thermal oxidation film of part C in FIG. 6F thicker than other thermal oxidation film in the groove, it becomes possible to expect strengthening the part which has so far been most liable to be etched in the etching step of the first thermal oxidation film.

Besides, in case a seam has been formed in the imbedded oxide film, the imbedded oxide film is removed from the upper part to a degree that such seam does not remain, after which the non-single crystal silicon film for thermal oxidation is deposited over the whole surface, by which it becomes possible to form a seamless element isolation structure.

The present invention is also a method for forming a trench type element isolation structure, which comprises, a step for depositing an imbedded oxide film on said groove inside and said non-single crystal silicon film, before said thermal oxidation step, and further, said thermal oxidation step is a step for forming a said second and third thermal oxidation film by carrying out thermal oxidation over said imbedded oxide film.

According to such forming method, in addition to the fact that the formation of recess on the edge part of the imbedded oxide film in the trench, in the etching step of the first thermal oxidation film can be prevented, because the thermal oxidation step is operated after depositing the imbedded oxide film, the imbedded oxide film is kept at a high temperature in the thermal oxidation step, or so-called bake-tightened, and especially, as in the part shown as 40 in FIG. 17, it becomes possible to reinforce the joint of the weak joint part 40 of the imbedded oxide film.

Accordingly, as shown in FIGS. 17A–C, it becomes possible to prevent formation of a recess in the imbedded oxide film which has been experienced in the conventional method, and to form an element isolation structure having good isolation characteristics.

The present invention is also a method for forming a trench type element isolation structure which comprises, further a film-thinning step for reducing the film thickness from the upper surface of the imbedded oxide film until said non-single crystal silicon film expose, between the thermal oxidation step and said removing step, and characterized by forming said imbedded oxide film so as to form said third thermal oxidation film on the side surface of said imbedded oxide film projecting upward from the surface of said silicon substrate.

Especially, according to this forming method, because there is not included a film removing step by dry etching as in the conventional step, it is possible to prevent formation of damage on the substrate.

The present invention is also a method for forming a trench type element isolation structure which comprises, further a step for forming a silicon nitride film on said non-crystal silicon film on both sides of said groove, and further comprises, in said film-thinning step, steps for reducing the film thickness of said imbedded oxide film using said silicon nitride film as a stopper, leaving said imbedded oxide film only in said groove, followed by removing said silicon nitride film.

According to such forming method, due to the use of a silicon nitride film having large etching selectivity to the silicon oxide film as a stopper in the film thinning step, it is possible to control the height of the imbedded oxide film from the substrate surface in good precision, and to lessen the dispersion of the heights of the imbedded oxide film from the substrate surface.

The present invention is also a method for forming a trench type element isolation structure which comprises, a step for reducing the film thickness from the upper surface of the imbedded oxide film until said non-crystal silicon film is exposed, between said deposition step and said thermal oxidation step, and further, a step for removing said thermal oxidation film from the upper surface of the non-single crystal silicon film, between said thermal oxidation step and said removing step.

Especially, according to such forming method, the oxidation rate of the lateral side wall of the non-single crystal silicon film which has a short distance for the oxidation species to diffuse through the imbedded oxide film is larger than the oxidation rate of the groove bottom part and the like, and accordingly, it becomes possible to form the film thickness of the third thermal oxidation film formed on the lateral wall part thicker than the film thickness of the second thermal oxidation film formed on the groove bottom part.

The present invention is also a method for forming a trench type element isolation structure which comprises, a step for forming a silicon nitride film on said non-single crystal silicon films on both sides of said groove, and further a step for reducing the film thickness of said imbedded oxide film using said silicon nitride film as a stopper and leaving said imbedded oxide film only inside the groove, between said deposition step and said thermal oxidation step, and further, a step for removing said silicon nitride film after the thermal oxidation step.

Even according to such a method, the height of the imbedded oxide film from the substrate surface can be controlled in good precision, and the dispersion of the heights of the imbedded oxide film can be made small.

The above thermal oxidation step is preferably a high temperature thermal oxidation step to be performed at 1000° C. or higher.

It is because, by carrying out the thermal oxidation step at 1000° C. or higher, it becomes possible to tighten by baking the previously deposited imbedded oxide film, and to strengthen the bonding of the weak joint of the imbedded oxide film.

The above forming method may include a thermal oxidation step for oxidizing said surface of said groove wall and on the side wall part of said non-single crystal silicon film, between said groove formation step and said thermal oxidation step.

By forming a thermal oxidation film twice, particularly it becomes possible to form the film thickness of the second thermal oxidation film inside the grooves to be formed in layers and the third thermal oxidation film on the side wall part of non-single crystal silicon film in thick layers.

The film thickness of said third thermal oxidation film is preferably 30–100 nm, because the film is not etched in the step for removing the first thermal oxide film.

The film thickness of said third thermal oxidation film is preferably thicker than that of the second thermal oxidation film.

The present invention also provides a trench type element isolation structure comprising an imbedded oxide film projecting upward from said silicon substrate surface being imbedded in a groove formed on a silicon substrate through a thermal oxidation film, characterized in that the film thickness of the third thermal oxidation film formed on the surface of said groove higher than said silicon substrate surface and the second thermal oxidation film formed on the surface of said groove lower than said silicon substrate surface has an overhang part gradually overhanging outward in the vicinity of said silicon substrate surface so that the film thickness of said second and third thermal oxidation film in a direction perpendicular to the groove wall of said groove becomes the thickest in the vicinity of said silicon substrate surface.

According to such trench type element isolation structure, unlike the conventional structure, no recess is formed on the edge part of the imbedded oxide film and the upper part is flat, and further, the third thermal oxidation film smoothly overhangs outward in the vicinity of the substrate surface. Accordingly, in case of forming a transistor having a gate electrode on a trench type element isolation structure, the gate electrode can be formed with a smooth shape especially at the bottom part, so that it becomes possible to prevent occurrence of electric field concentration in the gate electrode at the upper part of the edge of the imbedded oxide film which has been experienced with the conventional structure, and to prevent reverse narrow channel effect of the transistor.

The above film thickness of said third thermal oxidation film is preferably thicker than that of the second thermal oxidation film.

It is preferable for the upper surface of said imbedded oxide film to be further covered with a thermal oxidation film.

The present invention also provides a DRAM memory cell structure using a trench type element isolation structure, comprising a plurality of MOS transistors formed on a semiconductor substrate, an insulation film formed on said MOS transistor, and a bit line and a capacitor electrode which are respectively electrically connected with the source region and drain region of the MOS transistor through a contact hole provided on said insulation film, wherein electrical insulation is made between said plural MOS transistors by the trench type element isolation structure formed on said semiconductor substrate.

As described above, by using a trench type isolation structure of the present invention, development of a reverse narrow effect in the integrated memory cell can be prevented, and dispersion of inter-memory cell element characteristics attributed to the dispersion of channel widths can be suppressed, thereby making it possible to obtain stabilized operation of the DRAM memory cell.

BRIEF DESCRIPTION OF THE DRAWINGS

FIGS. 1A–1F are sectional views of a method of forming a trench type element isolation structure according to Embodiment 1 of the present invention.

FIGS. 4A–4I are sectional views of a method of forming a trench type element isolation structure according to Embodiment 4 of the present invention.

FIGS. 5A–5H are sectional views of a method of forming a trench type element isolation structure according to Embodiment 5 of the present invention.

FIGS. 6A–6J are sectional views of a method of forming a trench type element isolation structure according to Embodiment 6 of the present invention.

DESCRIPTION OF THE PREFERRED EMBODIMENTS

Embodiment 1

Figure 2A:
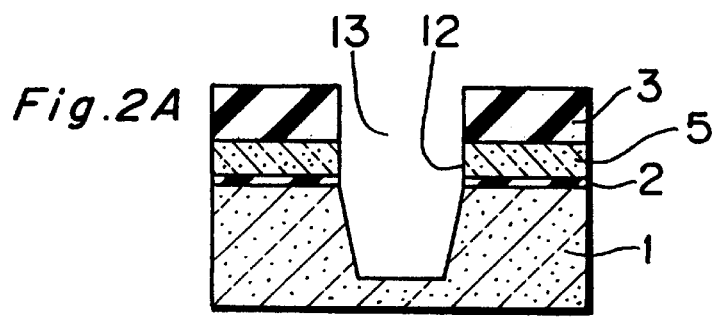
FIGS. 2A–2F are sectional views of a method of forming a trench type element isolation structure according to Embodiment 2 of the present invention.

FIGS. 1A–1F show sectional view of a method of forming a trench type element isolation structure according to Embodiment 1 of the present invention.

First, as shown in FIG. 1A, on a substrate 1 there are sequentially formed by thermal oxidation about 5 to 30 nm of the under-laid oxide film 2 which is a silicon oxide film, and about 100 to 300 nm of polysilicon film 5 as the non-single crystal silicon film, by lamination. By anisotropic etching, a polysilicon film 5 in the element isolation forming region and an under-laid oxide film 2 are etched, and further, the substrate 1 is etched to a depth of about 100 to 500 nm to form a groove 13 in the substrate.

By this step, it becomes possible to form a groove 13 extending from the surface of the polysilicon film 5 to the silicon substrate 1 so that the polysilicon film 5 has a side wall 12 continued to the groove wall part of the silicon substrate 1.

As the non-single crystal silicon film, an amorphous silicon film is usable in addition to the polysilicon film.

Next, as shown in FIG. 1B, about 5 to 50 nm of a silicon oxide film 10 is formed inside the groove by thermal oxidation. At this time, the side wall part 12 and the upper surface of the polysilicon film 5 are simultaneously oxidized.

In such thermal oxidation step, the oxidizers such as $O_2$ and $H_2O$ are liable to diffuse in the oxide film, and diffuse in the under-laid oxide film 2, because of which the silicon 1, 5 in the vicinity of the under-laid oxide film 2 are further oxidized, and the structure becomes such that the film thickness of the thermal oxidation film 10 as shown in FIG. 1B become smoothly thick toward outside in the vicinity of the connection part with the under-laid oxide film 2.

Next, as shown in FIG. 1C, an imbedded oxide film 11 which is a silicon oxide film, is deposited on the whole surface by CVD step.

Next, as shown in FIG. 1D, part of the thermal oxidation film 10 formed on the upper part of the polysilicon film 5, thermal oxidation film 10 in the groove, and imbedded oxide film 11, and a part of the polysilicon film 5 are removed from the upper part by CMP step.

Next, as shown in FIG. 1E, by dry etching step, the polysilicon film 5 is selectively removed, and finally, as shown in FIG. 1F, the under-laid oxide film 2 is removed by wet etching by hydrofluoric acid to form a trench type element isolation structure having thermal oxidation film formed on the lateral side of the imbedded oxide film 11 projecting upward from the surface of the silicon substrate 1.

As described above, according to the method relating to Embodiment 1 of the present invention, in the etching step of the under-laid oxide film 2 as shown in FIG. 1F, the imbedded oxide film 11 and thermal oxidation film 10 are simultaneously etched from the upper part, but as the surroundings of the imbedded oxide film 11 are surrounded not by the oxide film 20 formed by CVD step as hitherto but by the thermal oxidation film 10 having high etching resistance, no recess is formed on the edge part of the imbedded oxide film 11 in the groove, contrary to the conventional case.

Figure 11:
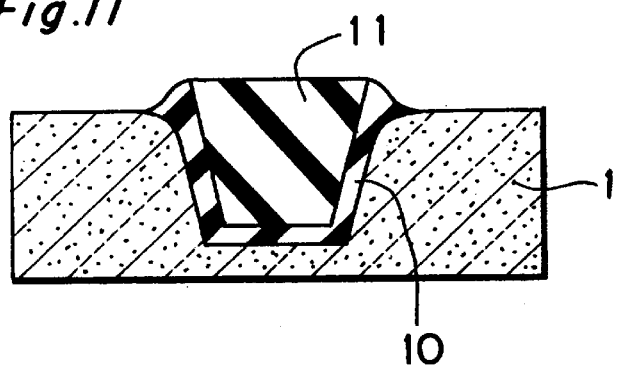
FIG. 11 is a sectional view of a trench type element isolation structure manufactured according to Embodiment 1 of the present invention.

FIG. 11 is a trench type element isolation structure manufactured by the method according to Embodiment 1 of the present invention.

According to such element isolation structure, the upper surface of the imbedded oxide film 11 which acts as an element isolation region is higher than the surface of the semiconductor substrate 1, and the oxide film 10 formed by thermal oxidation on the inner wall of groove is formed not only inside the groove but also on the side wall of the imbedded oxide film 11 which is higher than the substrate, and no recess as in the conventional structure is produced in the imbedded oxide film 11.

Furthermore, the thermal oxidation film 10 extends smoothly to the active region side 23 (outward) in the vicinity of the silicon substrate surface.

Figure 16:
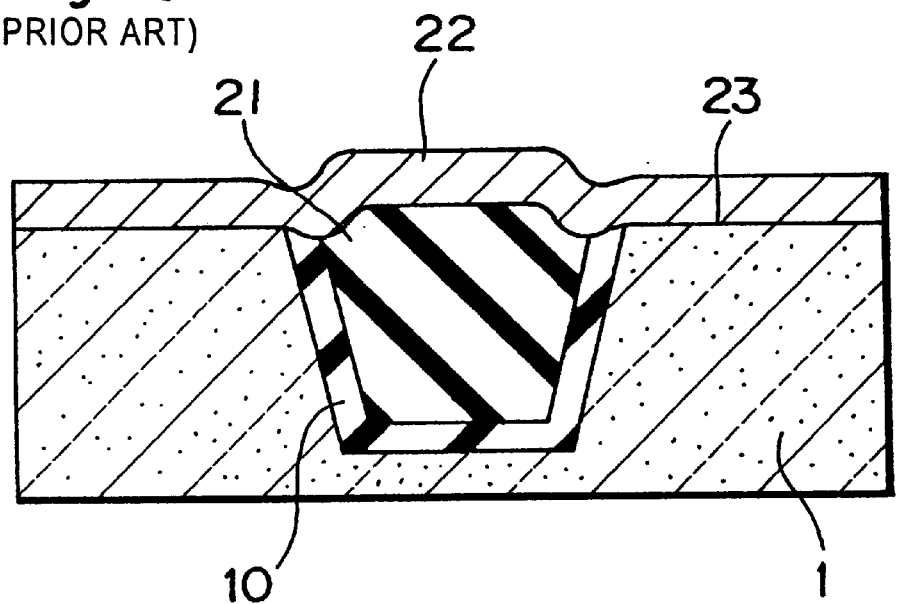
FIG. 16 is a sectional structural view of a transistor having a gate electrode formed on a conventional trench type element isolation structure.

Accordingly, in the transistor made by forming a gate electrode on such trench type isolation structure, formation of electric field concentration in the gate electrode on the upper part of the edge of the imbedded oxide film 11 as generated with respect to the gate electrode structure 22 of conventional structure as shown in FIG. 16 can be prevented, by which it becomes possible to prevent the reverse narrow channel effect of the transistor.

Embodiment 2

FIGS. 2A–2F show sectional views of a method of forming a trench type element isolation structure according to Embodiment 2 of the present invention.

First, as shown in FIG. 2A, there were sequentially formed by lamination on a substrate 1 by thermal oxidation about 5 to 30 nm of the under-laid oxide film 2 of a silicon oxide film formed, about 30 to 100 nm of polysilicon film 5, and about 100 to 300 nm of silicon nitride film 3. Thereafter, there were opened by anisotropic etching a silicon nitride film 3 in the element isolation forming region, a polysilicon film 5, and an under-laid oxide film 2, and further, the substrate 1 was etched to a depth of about 100 to 500 nm to form a groove 13 in the substrate.

Figure 2B:
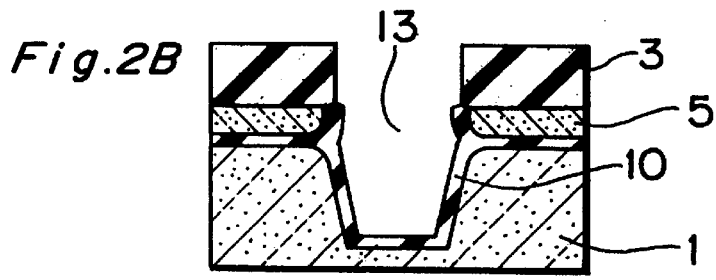

Next, as shown in FIG. 2B, by thermal oxidation, about 5 to 50 nm of thermal oxidation film 10 is formed in the inside of the groove. According to such step, the side wall part 12 of the polysilicon film 5 is also oxidized.

Figure 2C:
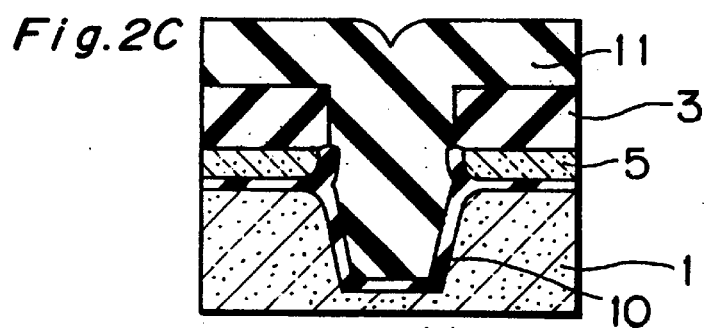

Next, as shown in FIG. 2C, by CVD step, a silicon oxide film 11 is deposited over the whole surface.

Figure 2D:
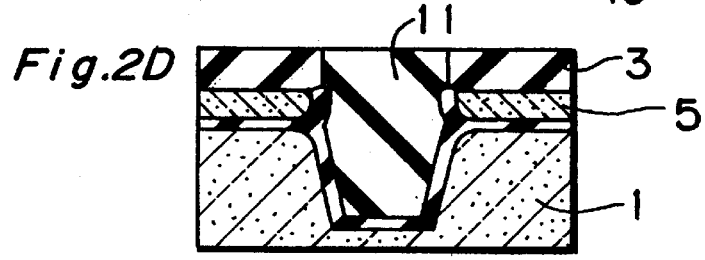

Next, as shown in FIG. 2D, by CMP step, the oxide film 11 formed on the upper part of the silicon nitride film 3 is removed.

Figure 2E:
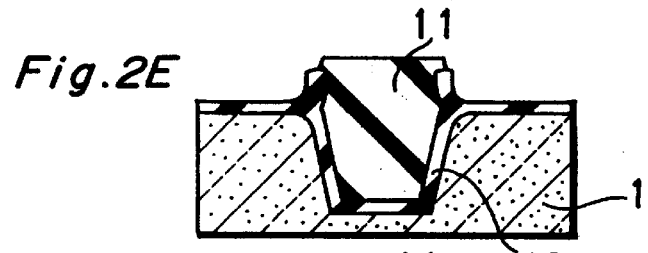

Next, as shown in FIG. 2E, the silicon nitride film 3 is removed by heated phosphoric acid, followed by removal of polysilicon film 5 by dry etching step.

Figure 2F:
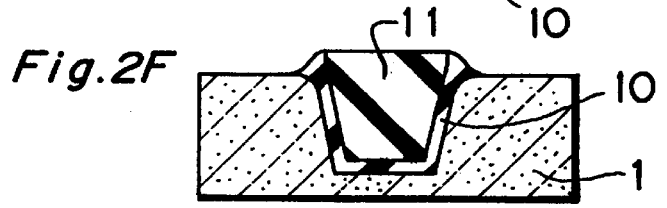

Finally, as shown in FIG. 2F, the silicon oxide film 2 is removed by wet etching by hydrofluoric acid to form a trench type element isolation structure.

According to such a forming method, because of the use of a silicon nitride film 3 which has a large etching selectivity to the silicon oxide film as a stopper in the CMP step as shown in FIG. 2D, there is an additional effect to the effect stated in Embodiment 1 above that the height of the imbedded oxide film projecting from the substrate surface can be controlled in good precision, and it becomes possible to lessen the dispersion of the heights of the imbedded oxide films between the elements.

Further, by employing such method in Embodiment 2, it becomes possible to make a trench type element isolation structure having a structure as shown in FIG. 11 as in Embodiment 1, and to obtain the same effect as in Embodiment 1.

Embodiment 3

FIGS. 3A–3H show sectional views of a method of forming a trench type element isolation structure according to Embodiment 3 of the present invention.

Figure 14A:
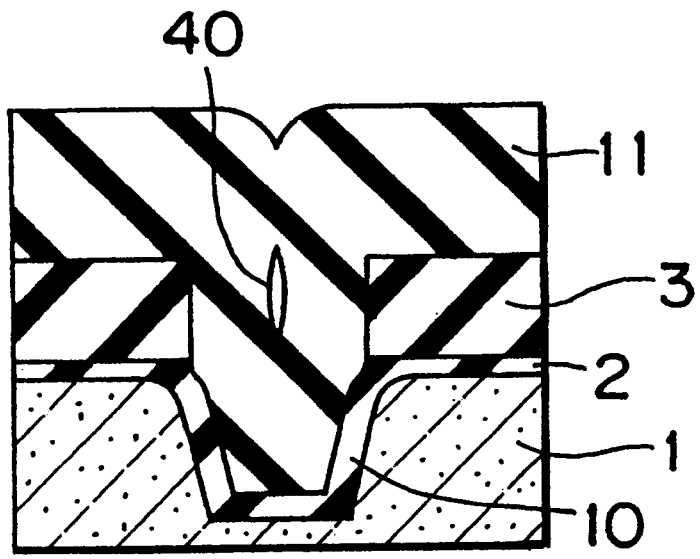
FIGS. 14A–14C are sectional views of a method of forming a conventional trench type element isolation structure.

When the width of the trench groove becomes narrow in consequence of the micronization of the element, development of seam 40 as shown in FIG. 14A is a problem, but this Embodiment 3 is effective to prevent development of such seam.

Figure 13A:
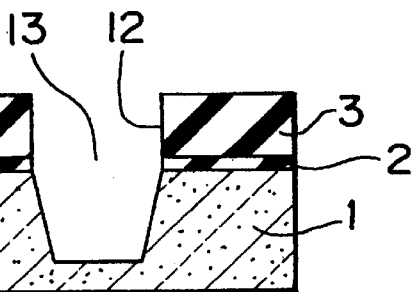
FIGS. 13A–13F are sectional views of a method of forming a conventional trench type element isolation structure.
Figure 13B:
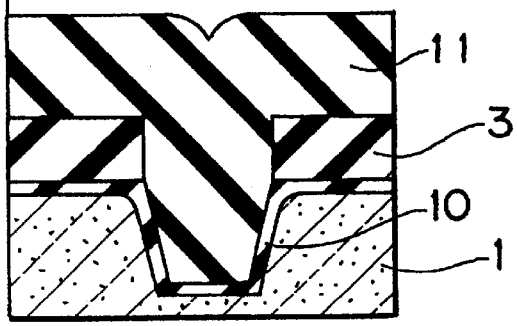
Figure 13C:
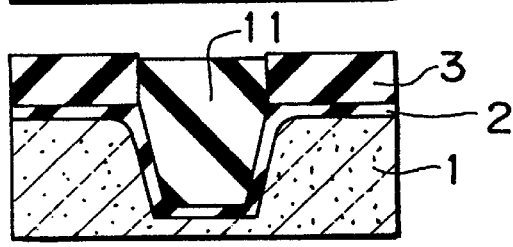
Figure 13D:
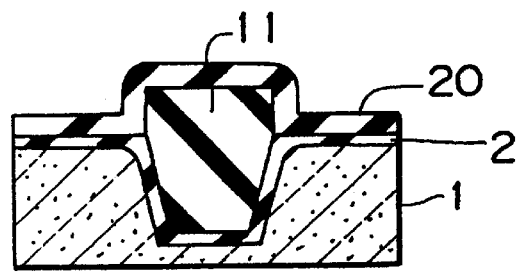
Figure 13E:
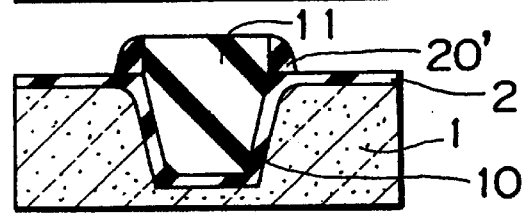
Figure 13F:
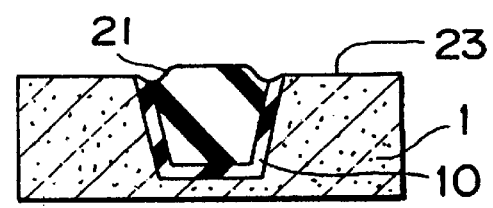

Namely, in case of imbedding an imbedded oxide film 11 by the conventional step of FIG. 13B, when the aspect ratio of the groove becomes large, the imbedding becomes imperfect, and as shown in FIG. 14A, a seam 40 is developed in the groove. In FIG. 14A, the part 1 shows a substrate, 2 a thermal oxidation film, and 3 a silicon nitride film.

Figure 14B:
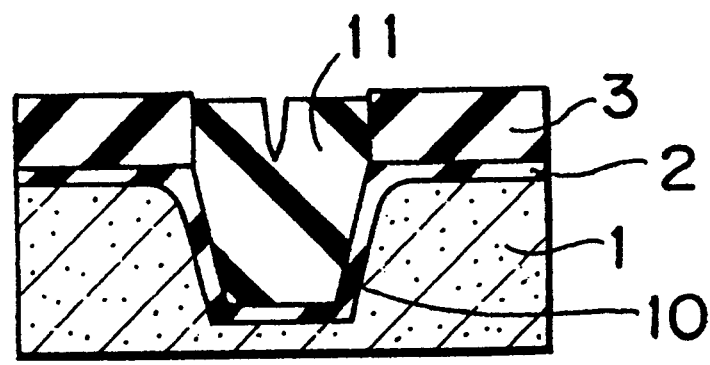
Figure 14C:
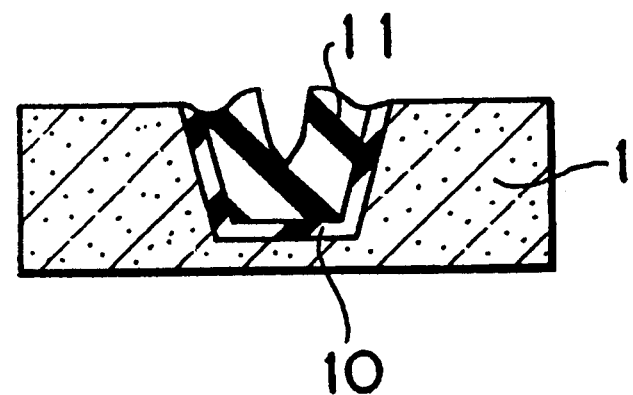
Figure 15A:
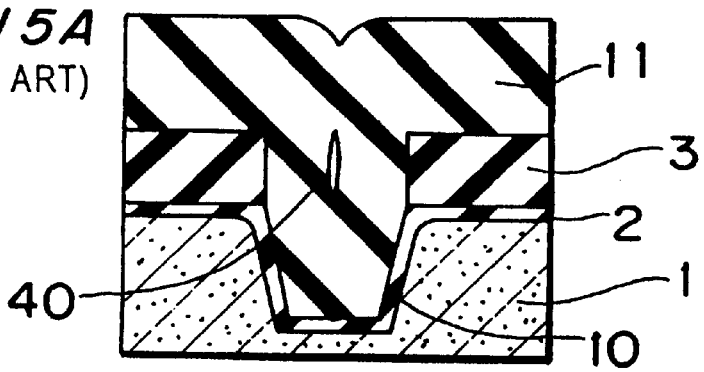
FIGS. 15A–15B are sectional views of a method of forming a conventional trench type element isolation structure.
Figure 15B:
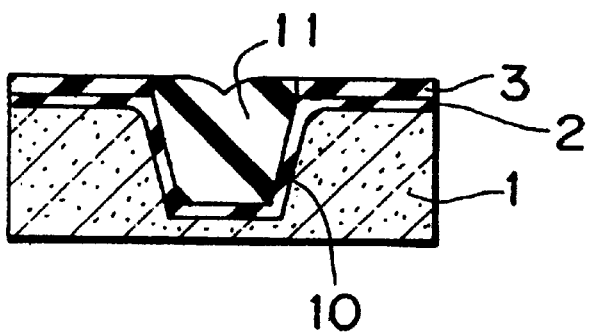

As shown in FIGS. 14B and 14C, in the structure including such seam 40, the seam expands further in removing silicon oxide film 2 with hydrofluoric acid, and there is an aptitude for the wiring material formed in the next step to enter into the seam and cause short-circuiting. In order to do away with such seam 40 and to form the trench isolation, it may be suggested to remove the imbedded oxide film 11 to the seam position by etch back and to imbed the oxide film again. However, as shown in FIGS. 15A and 15B, in an ordinary dry etching, the etching selectivity of silicon oxide film to silicon nitride film is small, and as shown in FIG. 15B the silicon nitride film 3 is also removed in the etching step for removing the seam 40, and therefore it becomes impossible to use a silicon nitride film 3 as a stopper at the time of CMP.

Figure 3A:
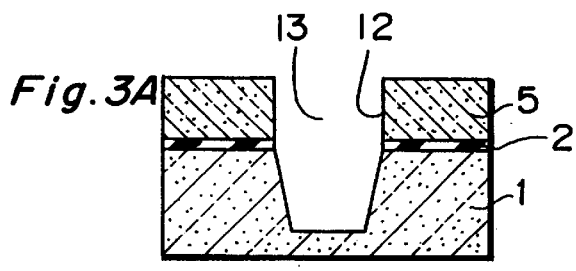
FIGS. 3A–3H are sectional views of a method of forming a trench type element isolation structure according to Embodiment 3 of the present invention.
Figure 3F:
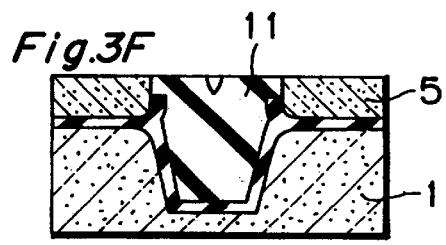
Figure 3B:
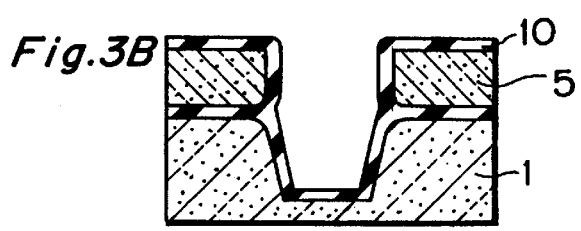
Figure 3G:
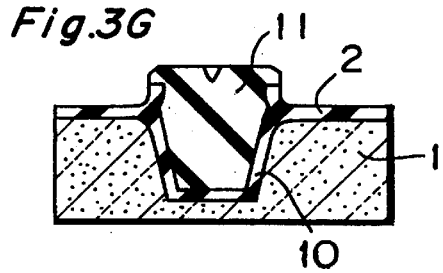
Figure 3C:
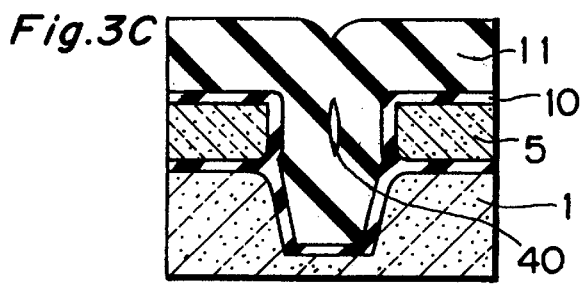

In this embodiment, therefore, due to the narrow width of the groove 13, a seam 40 is developed in the groove as shown in FIG. 3C. The steps of FIGS. 3A and 3B are same as those of Embodiment 1, except the narrow groove width.

Figure 3H:
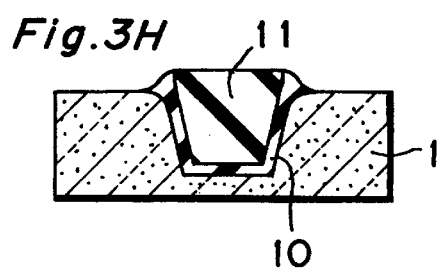
Figure 3D:
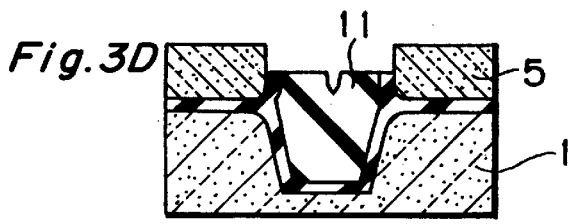

Next, in the step of FIG. 3D, the imbedded oxide film 11 which has developed the seam 40 is eliminated from the upper part to the predetermined position, i.e., until the seam 40 is exposed, by dry etching or the like.

Figure 3E:
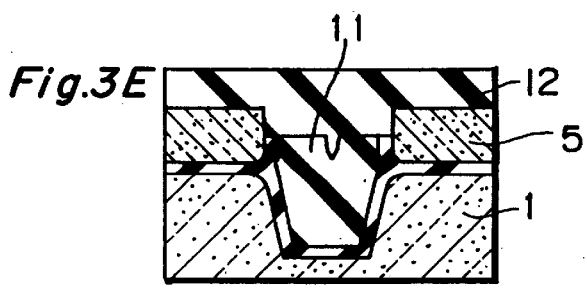

Next, as shown in FIG. 3E, the upper layer imbedded oxide film 12 is deposited on the whole surface by CVD step. In the imbedding step of the upper layer imbedded oxide film 12, the aspect ratio of the groove is smaller than in the case of forming the imbedded oxide film 11, and therefore no seam is developed.

Next, as shown in FIGS. 3F–3H, the steps similar to those of the steps of FIGS. 1D–1F in Embodiment 1 are practiced to complete the trench type element isolation structure.

In this practice, the imbedded oxide film 11 is etched until the seam 40 is removed to about half the volume, but the seam may be allowed to remain in the possible range at the time of deposition of the second oxide film 12, or, it may be so practiced that, by carrying out a hydrofluoric acid treatment after the dry etching of the imbedded oxide film 11, the seam opening is expanded to improve the seam imbedding efficiency at the time of the deposition of the second oxide film.

According to the method of Embodiment 3, in addition to the fact that the same effect as that of Embodiment 1 is obtainable, development of seam can be prevented, short-circuiting of an electrode formed on the trench type element isolation can be reduced, and it becomes possible to expect an improvement in the forming yield of the integrated circuit in case of using such trench type element isolation.

Since the etching selectivity of the polysilicon film 5 to the imbedded oxide film 11 and thermal oxidation film 10 and in the dry etching step of the imbedded oxide film 11 and thermal oxidation film 10 as shown in FIG. 3D is very large, only the imbedded oxide film 11 and thermal oxidation film 10 can be etched without the polysilicon film 11 being etched. Accordingly, it does not occur for the polysilicon film 12 which is to be a stopper in the CMP step in FIG. 3F to become thin in such step.

Furthermore, by using such a method for the present Embodiment 3, it becomes possible to make a trench type element isolation structure having the same structure as that of Embodiment 1 as shown in FIG. 11, by which the same effect can be obtained.

Embodiment 4

FIGS. 4A–4I show sectional views of a method of forming a trench type element isolation structure according to Embodiment 4 of the present invention.

The steps of FIGS. 4A–4D are the same as those of FIGS. 3A–3D in Embodiment 3, except the point that there is no seam 40. In the step of FIG. 4D, said imbedded oxide film 11 and thermal oxidation film 10 are removed by dry etching from the upper part to the predetermined position between the upper surface and the bottom surface of the polysilicon film 5 to expose at least a part of the lateral side and upper surface of said polysilicon film 5.

Continued from the above, as shown in FIG. 4E, the exposed side surface and upper surface of the polysilicon film 5 are again thermal oxidation to oxidize the exposed side surface and upper surface of the polysilicon film 5 so as to thicken the tip parts of the thermal oxidation film 10 on both sides of the imbedded oxide film 11.

In the thermal oxidation step of polysilicon film 5 as above, because the oxidizer scarcely diffuses in the imbedded oxide film 11 in the trench groove, the silicon substrate 1 in the trench groove is scarcely oxidized. On the other hand, on the upper part from the surface of the silicon substrate 1, the oxidizer easily reaches the polysilicon film 5 surface, so that the side wall part 12 of the polysilicon film 5 is oxidized, and especially, in the step of FIG. 4B, the polysilicon 5 is further oxidized again, and the film thickness of the thermal oxidation film becomes thicker than other thermal oxidation films.

Next, as shown in FIG. 4F, using CVD step, the upper layer imbedded oxide film 12 is deposited on the whole surface.

The succeeding step of FIGS. 4G–4I is same as that of Embodiment 1 shown in FIGS. 1D–1F, and by carrying out the step as above the trench type element isolation is manufactured.

Above all, in this embodiment, it is possible to form the film thickness of the thermal oxidation film thick on the part A in FIG. 4, as described above. Accordingly, in the step of removing the under-laid oxide film 2 as shown in FIG. 4I, the protection of the imbedded oxide film 11 is further strengthened than in the above Embodiments 1–3.

In this embodiment, even when a seam 40 has been developed in the silicon oxide film 11 imbedded in the groove, the seam 40 can be imbedded by the second imbedded oxide film 12, in the same manner as in Embodiment 3.

As described above, in the forming method of the trench type element isolation according to Embodiment 4, the thermal oxidation film of the part A shown in FIG. 4E is thicker than other thermal oxidation film, and in the etching step of the under-laid oxide film 2 as shown in the step (i), it is further less being etched, and the development of the recess in the edge part of the imbedded oxide film 11 can be more effectively prevented.

Since the thickness of the thermal oxidation film 10 of such trench groove surrounding side wall (part A) can be formed thick individually without thickening the film thickness of the thermal oxidation film inside the trench groove, even in case of using such method in this embodiment, the film thickness of the thermal oxidation film 10 in the trench groove does not become thick, and no development of the seam 40 occurs by the narrowing of the trench groove width.

Embodiment 5

FIGS. 5A–5H show sectional views of a method of forming a trench type element isolation structure according to Embodiment 5 of the present invention.

In Embodiment 5, the steps of FIGS. 5A–5D are the same as those of FIGS. 1A–1D in Embodiment 1.

Next, as shown in FIG. 5E, the exposed upper surface of the polysilicon film 5 is again thermally oxidized to thicken the upper end part of the thermal oxidation film 10 of the side wall part 12 of the polysilicon film 5.

In the oxidation step of such polysilicon film 5, in the same manner as in Embodiment 4 above, in the inside of the trench groove, the silicon substrate 1 is scarcely oxidized, but on the upper part from the surface of the silicon substrate 1 the oxidizer easily reaches the surface of the polysilicon film 5, so that the oxidation progresses on the top surface of the polysilicon film 5 and on the side wall part 12, and especially, in the step of FIG. 5E, the polysilicon 5 is oxidized again to make the film thickness of the oxide film thicker than other portion of the oxide film.

Next, as shown in FIG. 5F, the thermal oxidation film 10 formed on the polysilicon film 5 by dry etching, the thermal oxidation film 10 in the groove, and the upper part of the imbedded oxide film 11 are removed by etching.

Next, as shown in FIG. 5G, the polysilicon film 5 is removed by dry etching, and further, as shown in FIG. 5H, the under-laid oxide film 2 is removed by wet etching by hydrofluoric acid to make a trench type element isolation structure.

As described above, in the forming method of the trench type element isolation according to Embodiment 5, the thermal oxidation film of the part B shown in FIG. 5E is thicker than other thermal oxidation film, and in the etching step of the under-laid oxide film 2 as shown in the step (h), it is further less being etched, and the development of the recess in the edge part of the imbedded oxide film 11 can be more effectively prevented.

Also, by employing the method of Embodiment 5 it is possible to manufacture a trench type element isolation structure having the similar structure as Embodiment 4 above.

Embodiment 6

FIGS. 6A–6J show sectional views of a method of forming a trench type element isolation structure according to Embodiment 6 of the present invention.

The steps up to FIGS. 6A–6D are the same as those of Embodiments 4 and 5 above.

Next, as shown in FIG. 6E, a polysilicon film 17 which is a non-single crystal silicon film for thermal oxidation is deposited on the whole surface, after which, as shown in FIG. 6F, the polysilicon film 17 is oxidized by thermal oxidation to form a thermal oxidation film 15.

Here, because the oxidizer scarcely diffuses in the imbedded oxide film 11, the film thickness of the thermal oxidation film in the trench groove shows scarce change. Against this, the oxidizer is apt to move in the oxidized polysilicon film 17, and the thermal oxidation progresses in the side wall part 12 of the polysilicon film 5 to cause the thickness of the thermal oxidation film FIG. 6F to be thicker than that in the trench groove.

Furthermore, on the upper surface of the imbedded oxide film 11, a thermal oxidation film 15 is formed by oxidation of the polysilicon film 17.

Next, as shown in FIG. 6G, by CVD step, the upper layer imbedded oxide film 16 is deposited on the whole surface.

Next, as shown in FIG. 6H, by CMP step, until the thermal oxidation film 15 which is formed on the imbedded oxide film 11 inside the groove is exposed (or up to the stage immediately before it) to reduce the film thickness of the upper layer imbedded oxide film 16, thermal oxidation film 15, and polysilicon film 5, from the upper part.

Next, as shown in FIG. 6I, the polysilicon film 5 is removed by dry etching, and further, as shown in FIG. 6J, the under-laid oxide film 2 is removed by wet etching by hydrofluoric acid to make a trench type element isolation structure.

As described above, in the forming method of Embodiment 6, because the thermal oxidation film 10 having high wet etching resistance is formed not only on the side wall of the imbedded oxide film 11 but also on the upper part thereof, the imbedded oxide film 11 is not etched in the step of removing the under-laid oxide film 2, and the development of the recess at the edge part of the imbedded oxide film 11 can be fully prevented.

By the above, in case of forming a gate electrode on the trench type element isolation, electric field concentration on the edge part can be prevented, thereby making it possible to prevent the reverse narrow channel effect.

Moreover, as it is possible to set the thickness of the thermal oxidation film 10 of the side wall part 12 of the part C in FIG. 6F thick without respect to the thickness of the oxide film inside the trench groove, even when the thermal oxidation film of the part C is formed thick, the film thickness of the thermal oxidation film inside the groove does not become thick, namely, it is possible to prevent the aspect ratio of the trench groove from becoming large, and to suppress development of the seam.

Also, as in the conventional method, a thermal oxidation film of the side wall part 12 of the imbedded oxide film 11 can be formed without carrying out anisotropic etching, and it becomes possible to prevent the damage by anisotropic etching in the active region 23 from being caused.

FIG. 6J shows a trench type element isolation structure made by the method according to Embodiment 6 of the present invention.

In such element isolation structure, the upper surface of the imbedded oxide film 11 which acts as the element isolation region projects upward from the surface of the semiconductor substrate 1, and the oxide film 10 formed by thermal oxidation in the inner wall of the groove 13 is formed not only in the inside of the groove 13 but also on the side surface of the imbedded oxide film 11 which is on the higher part than the surface of the substrate 1, and no recess as in the conventional structure is developed on the imbedded oxide film 11.

Also, the thermal oxidation film 10 extends smoothly to the active region side 23 (outward) in the vicinity of the silicon substrate surface, and the film thickness in the vertical direction to the groove 13 side of the thermal oxidation film 10 on the upper part higher than the surface of the substrate 1 is thicker than the thermal oxidation film 10 inside the groove 13.

Accordingly, in the transistor having a gate electrode formed on the trench type element isolation structure, development of the electric field concentration in the gate electrode on the upper part of the edge of the imbedded oxide film 11 as heretofore can be prevented, and it becomes possible to suppress the reverse narrow channel effect of the transistor.

Embodiment 7

FIGS. 7A–7F show sectional views of a method of forming a trench type element isolation structure according to Embodiment 7 of the present invention.

Figure 7A:
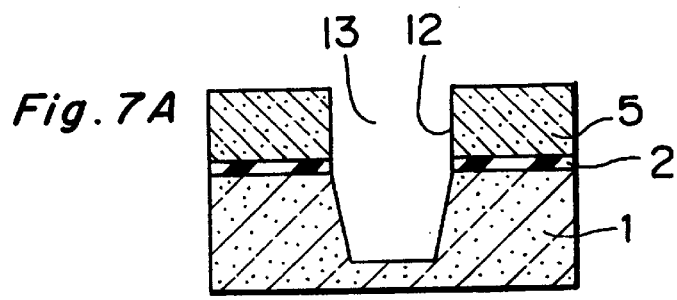
FIGS. 7A–7F are sectional views of a method of forming a trench type element isolation structure according to Embodiment 7 of the present invention.

First, as shown in FIG. 7A, there are sequentially formed on a silicon substrate 1 by thermal oxidation about 5 to 30 nm of the under-laid oxide film 2 and about 100 to 300 nm of polysilicon film 5. Thereafter, there are removed by anisotropic etching a polysilicon film 5 in the element isolation forming region and an under-laid oxide film 2, and further, the silicon substrate 1 is etched to a depth of about 100 to 500 nm to form a groove 13 in the silicon substrate.

Figure 7B:
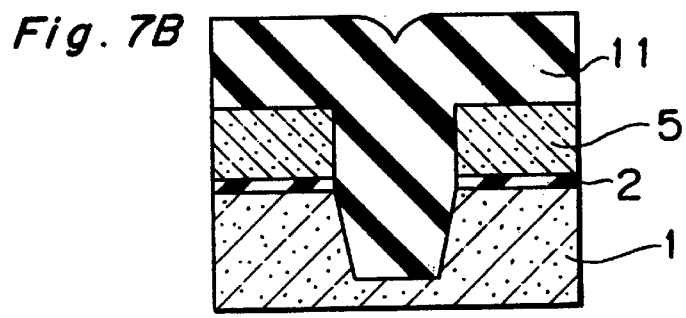

Next, as shown in FIG. 7B, by CVD step, imbedded oxide film 11 is deposited on the whole surface.

Figure 7C:
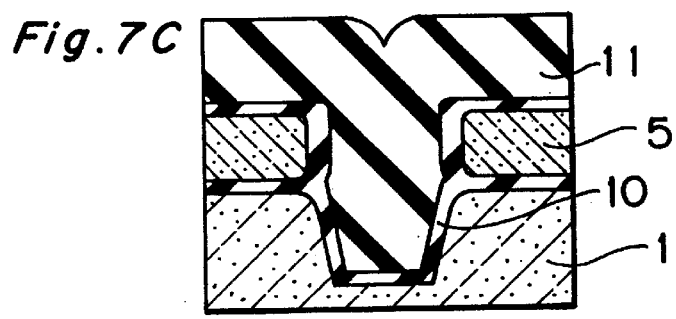

Next, as shown in FIG. 7C, the thermal oxidation film 10 is diffused over said imbedded oxide film 11 to form a thermal oxidation film 10 to about 5 to 50 nm in the inside of the groove 13. In such step, the side wall part 12 and the upper surface of the polysilicon film 5 are also oxidized, but the part nearer to the surface of the imbedded oxide film 11 is less regulated in the rate of diffusion of oxidizer in the imbedded oxide film (large amount of oxidizer reaches) and easily oxidized, and the side wall part 12 of the polysilicon is more largely oxidized than the inner wall of the silicon groove.

Accordingly, if it is desired to make the film thickness of the thermal oxidation film 10 on the inner wall part of the groove 13 relatively thick, it is recommended to carry out the oxidation of the inner wall of the groove 13 before the imbedding of the imbedded oxide film 11 and reduce the oxidation amount in the oxidizing step to be carried out over the imbedded oxide film 11.

Figure 7D:
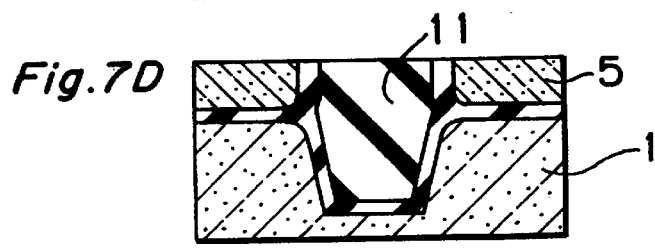

Next, as shown in FIG. 7D, by CMP step, the film thickness is reduced, and the oxide film formed on the upper part of the polysilicon film 5, the thermal oxidation film 10 in the groove, and a part of the imbedded oxide film 11 are removed.

Figure 7E:
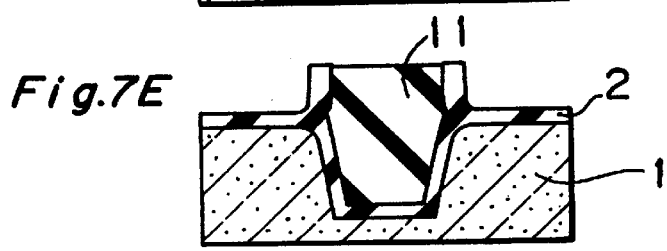
Figure 7F:
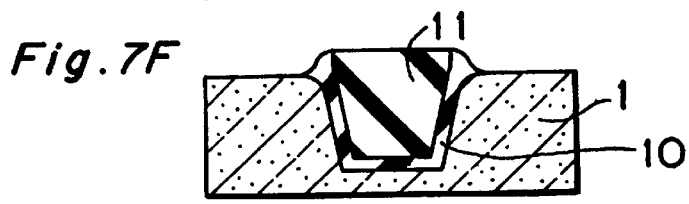

Next, as shown in FIG. 7E, the polysilicon film 5 is removed by dry etching step, and then, as shown in FIG. 7F, the under-laid oxide film 2 is removed by wet etching by hydrofluoric acid to form a groove type element isolation structure.

On the lateral side of the imbedded oxide film 11 on the upper part of the groove 13, in thermal oxidation, a thermal oxidation film 10 is formed thick by diffusing under-laid oxide film 2 by the oxidizer, so that in removing the under-laid oxide film 2 by wet etching, consumption of the oxide film on the lateral side of the imbedded oxide film 11 on the upper part of the groove 13 can be prevented.

Especially, when the film thickness of the thermal oxidation film 10 on the lateral side of the imbedded oxide film 11 on the upper part of the groove 13 is made larger than the film thickness of the under-laid oxide film 2, consumption of the thermal oxidation film 10 on the lateral side of the imbedded oxide film 11 on the upper part of the groove 13 in removing the under-laid oxide film 2 can be further prevented, and it becomes possible to prevent fall down of the imbedded oxide film 11 at the edge part.

Also, by using the method according to Embodiment 7, it becomes possible to manufacture a trench type element isolation structure as shown in FIG. 11.

In addition, according to the method of this embodiment, because the thermal oxidation film 10 is formed on the inner wall of the groove by thermal oxidation after imbedding the imbedding oxide film 11 in the groove formed on the silicon substrate 11, the imbedded oxide film 11 is exposed to high temperature and a so-called tightening by baking occurs.

Figure 17A:
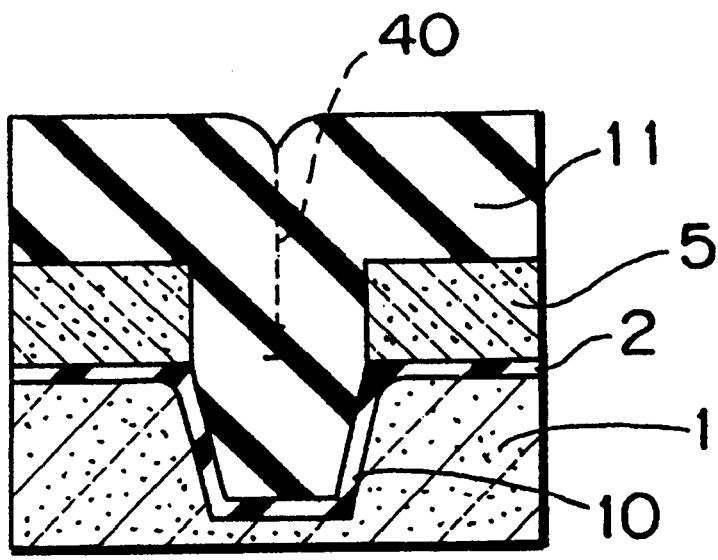
FIGS. 17A–17C are sectional views of a method of forming a conventional trench type element isolation structure.

Accordingly, in the joint 40 at the time of the formation of the imbedded oxide film 11 as shown in FIG. 17A, a physicochemical change in tissue can be developed to enhance the combination force of the above joint 40.

Figure 17B:
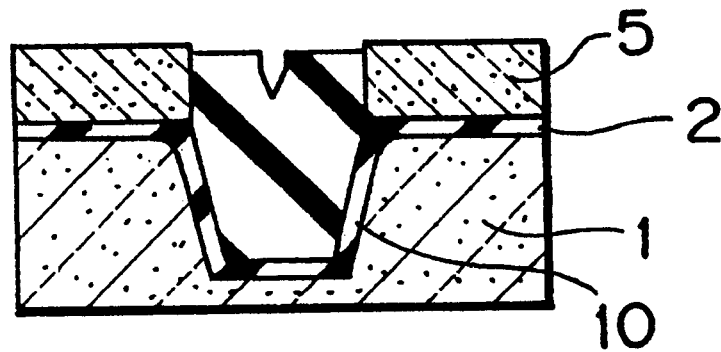
Figure 17C:
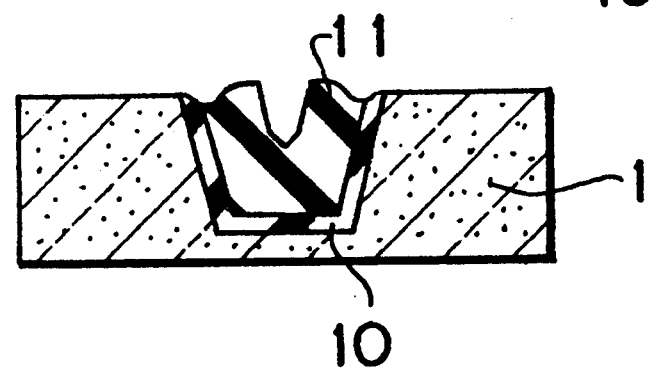

By this step, development of recess along the joint 40 which used to occur in removing the wet etching of the imbedded oxide film 11 under the conventional method can be suppressed [FIGS. 17B and 17C].

This effect becomes particularly large by using a temperature higher than 1000° C. at which the oxide film becomes viscous fluid, and at such temperature it becomes possible to sew together the joint 40 fully.

Moreover, the etching rate in the wet etching by hydrofluoric acid of the imbedded oxide film 11 formed by CVD step is lowered by the reflow effect by said thermal oxidation, and the controllability of the etching of the imbedded oxide film 11 is improved, so that the dispersion of the height of the projections upward from the surface of the substrate of the imbedded oxide film 11 can be reduced.

Embodiment 8

FIGS. 8A–8F show sectional views of a method of forming a trench type element isolation structure according to Embodiment 8 of the present invention.

Figure 8A:
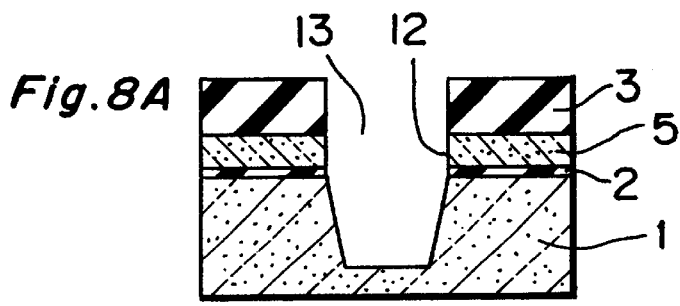
FIGS. 8A–8F are sectional views of a method of forming a trench type element isolation structure according to Embodiment 8 of the present invention.

First, as shown in FIG. 8A, there are sequentially formed by lamination on a silicon substrate 1 by thermal oxidation about 5 to 30 nm of the under-laid oxide film 2 about 30 to 100 nm of polysilicon film 5, and about 100 to 300 nm of silicon nitride film 3. Thereafter, there are opened by anisotropic etching a silicon nitride film 3, a polysilicon film 5, and an under-laid oxide film 2, and further, the substrate 1 is etched to a depth of about 100 to 500 nm to form a groove 13 in the silicon substrate.

Figure 8B:
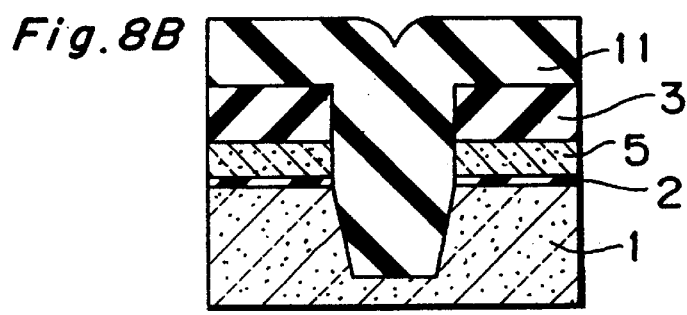

Next, as shown in FIG. 8B, by CVD step, an imbedded silicon oxide film 11 is deposited over the whole surface. Here, in the same manner as in Embodiment 7, before forming the imbedded oxide film 11, the inner wall of the groove may be previously thermally oxidized by about 5 to 50 nm.

Figure 8C:
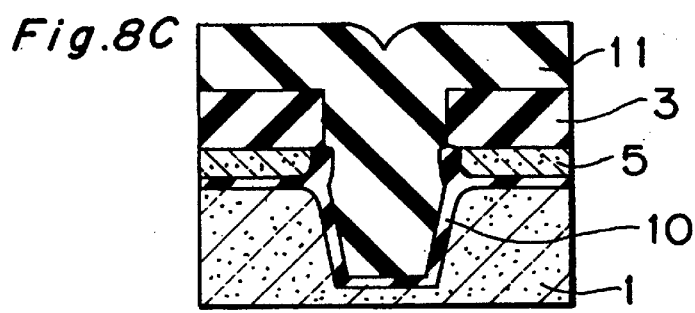

Next, as shown in FIG. 8C, by thermal oxidation step, the oxidizer is diffused over the imbedded oxide film 11 and the imbedded oxide film 10 is formed by about 5 to 50 nm. At this time, the side wall 12 of the polysilicon film 5 is also thermally oxidized.

Figure 8D:
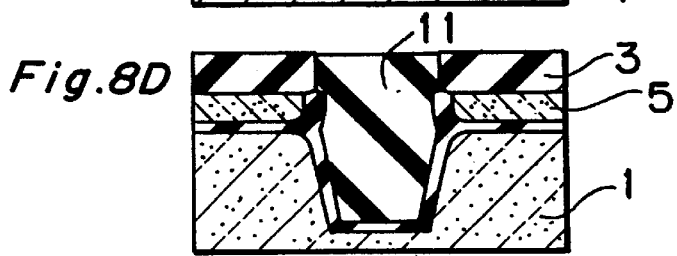

Further, as shown in FIG. 8D, by CMP step, the imbedded oxide film 11 formed on the upper part of the silicon nitride film 3, the thermal oxidation film 10 in the groove and a part of the imbedded oxide film 11 are removed.

Figure 8E:
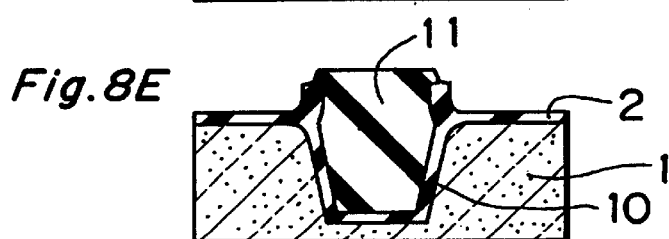

Next, as shown in FIG. 8E, by heated phosphoric acid, a silicon nitride film 3 is removed, and then the polysilicon film 5 is removed by dry etching step.

Figure 8F:
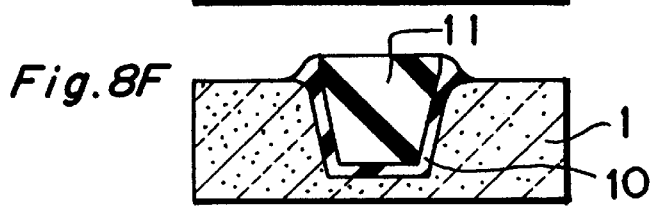

Lastly, as shown in FIG. 8F, the thermal oxidation film 2 is removed by wet etching using hydrofluoric acid to form a trench type element isolation structure.

In this manner, by using a method according to Embodiment 8, it becomes possible to manufacture a trench type element isolation structure having a structure as shown in FIG. 11, by which the same effect as that of the above Embodiment 7 can be obtained.

Especially, according to this embodiment, due to the use of a silicon nitride film 3 as a stopper in CMP step, in the same manner as in the above Embodiment 2, the height of the imbedded oxide film 11 projecting upward from the surface of the silicon substrate 1 can be controlled in good precision, and dispersion can be made small.

As such, in case of the use of a silicon nitride film 3 as a stopper, the number of the forming steps increases but it becomes possible to reduce the irregularity of heights of the imbedded oxide film 11. On the other hand, because the silicon nitride film 3 is of hard quality material, development of stress in oxidation is a problematic matter.

However, the matter of evolution of the stress can be sufficiently obviated by alleviating the stress by making the film thickness of the polysilicon film 5 more than about 30 nm. Also, by making the film thickness of the polysilicon film 5 no more than about 100 nm, excessive height of the aspect ratio is suppressed, and further, excessive development of bird's beak in oxidation can be prevented.

Embodiment 9

FIGS. 9A–9F show sectional views of a method of forming a trench type element isolation structure according to Embodiment 9 of the present invention.

Figure 9A:
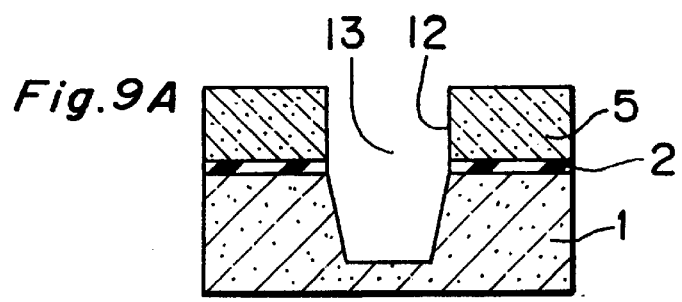
FIGS. 9A–9F are sectional views of a method of forming a trench type element isolation structure according to Embodiment 9 of the present invention.

First, as shown in FIG. 9A, there are sequentially formed on a silicon substrate 1 by thermal oxidation about 5 to 30 nm of the under-laid oxide film 2 and about 100 to 300 nm of polysilicon film 5. Thereafter, there are opened by anisotropic etching a polysilicon film 5 in the element isolation forming region and an under-laid oxide film 2, and further, the silicon substrate 1 is etched to a depth of about 100 to 500 nm to form a groove 13 in the silicon substrate 1.

Figure 9B:
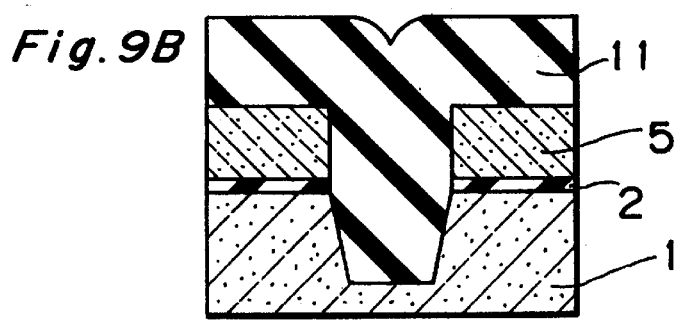

Next, as shown in FIG. 9B, by CVD step, the imbedded oxide film 11 is deposited on the whole surface. Here, in the same manner as in Embodiment 7, before forming the imbedded oxide film 11, the inner wall of the groove may be previously thermally oxidized by about 5 to 50 nm.

Figure 9C:
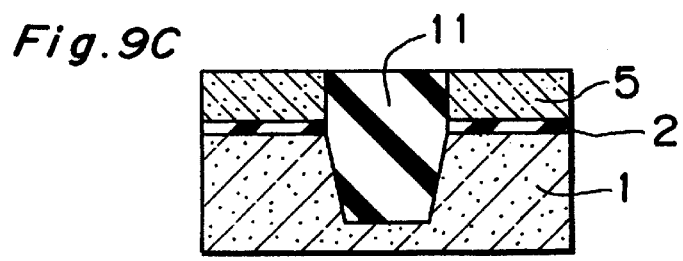

Next, as shown in FIG. 9C, by CMP step, the imbedded oxide film 11 formed on the upper part of the polysilicon film 5 and a part of the imbedded oxide film 11 in the groove are removed.

Figure 9D:
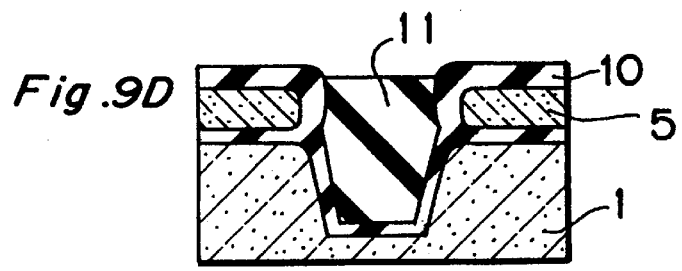

Next, as shown in FIG. 9D, by thermal oxidation step, an oxidizer is diffused over the imbedded oxide film 11 and the thermal oxidation film 10 is formed by about 5 to 50 nm in the groove.

In such case, as described above, the groove 13 is previously thermally oxidized and such thermal oxidation film and the thermal oxidation film that is formed over the imbedded oxide film 11 are used in combination, thereby allowing to control to some extent the distribution of the film thickness of the thermal oxidation film 10.

Figure 9E:
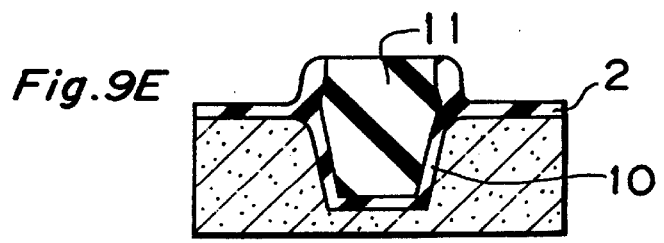

Next, as shown in FIG. 9E, the thermal oxidation film 10 formed on the upper part of the polysilicon film 5 by wet etching using hydrofluoric acid, after which the polysilicon film 5 is removed by dry etching step.

Figure 9F:
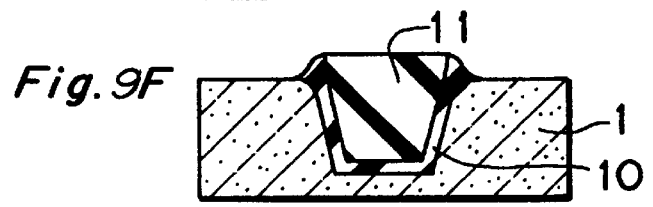

Next, as shown in FIG. 9F, the under-laid oxide film 2 is removed by wet etching by hydrofluoric acid to form a trench type element isolation structure.

In this manner, by using a method according to Embodiment 9, it becomes possible to manufacture a trench type element isolation structure having a structure as shown in FIG. 11, by which the same effect as that of the above Embodiment 7 can be obtained.

Furthermore, in the method according to this embodiment, as described above, compared with the film thickness of the thermal oxidation film on the inner wall of the groove, the oxidation amount of the side wall part 12 of the polysilicon film 5 can be made relatively large, and in the step of removing the under-laid oxide film 2, the lateral side of the imbedded oxide film 11 can be protected well, and further, the development of the recess in the edge part of the imbedded oxide film 11 can be further effectively prevented.

Embodiment 10

FIGS. 10A–10F show sectional views of a method of forming a trench type element isolation structure according to Embodiment 10 of the present invention.

Figure 10A:
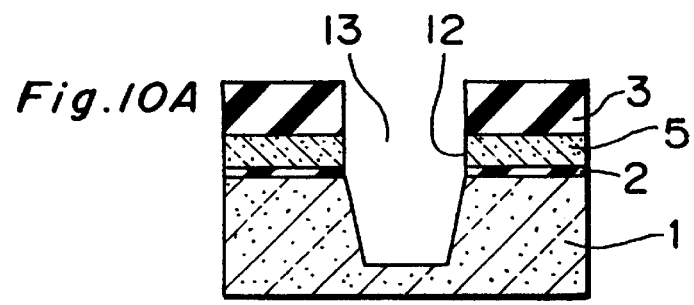
FIGS. 10A–10F are sectional views of a method of forming a trench type element isolation structure according to Embodiment 10 of the present invention.

First, as shown in FIG. 10A, there are sequentially formed on a silicon substrate 1 by thermal oxidation about 5 to 30 nm of a thermal oxidation film 2 by thermal oxidation, about 30 to 100 nm of polysilicon film 5, and about 100 to 300 nm of silicon nitride film 3. Continuously, there are opened by anisotropic etching a silicon nitride film 3 in an element isolation forming region, a polycrystal silicon film 5, and an under-laid oxide film 2, and further, the silicon substrate 1 is etched to a depth of about 100 to 500 nm to form a groove 12 in the silicon substrate.

Figure 10B:
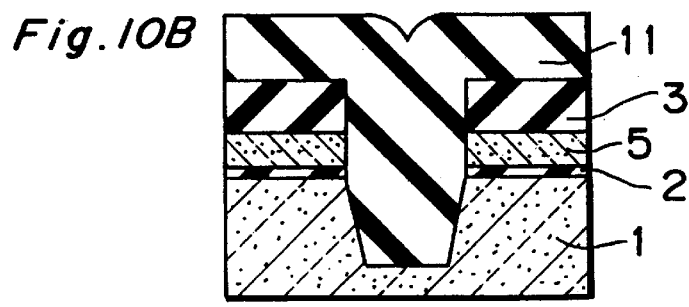

Next, as shown in FIG. 10B, by CVD step, an imbedded oxide film 11 is deposited over the whole surface. Here, in the same manner as in Embodiment 7, before forming the imbedded oxide film 11, the inner wall of the groove may be previously thermally oxidized by about 5 to 50 nm.

Figure 10C:
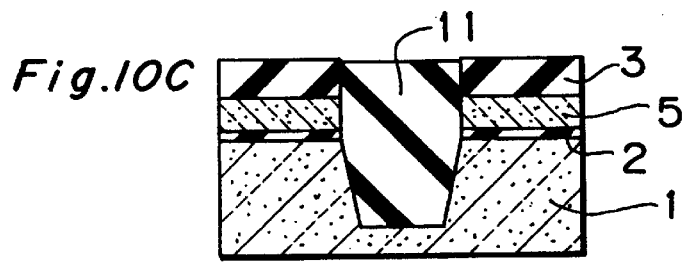

Further, as shown in FIG. 10C, by CMP step, using a silicon nitride film 3 as a stopper, the imbedded oxide film 11 formed on the upper part of the silicon nitride film 3 and a part of the imbedded oxide film 11 in the groove 13 are removed.

Figure 10D:
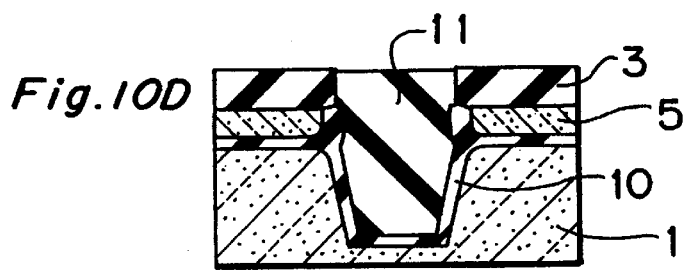

Next, as shown in FIG. 10D, by thermal oxidation step, the oxidizer is diffused over the imbedded oxide film 11 and the thermal oxidation film 10 is formed by about 5 to 50 nm inside the groove. In such step, as described above, by using in combination with the thermal oxidation film previously formed before forming the imbedded oxide film 11, the oxidation amount of the side wall of the polysilicon film 5 and the oxidation amount of the inner wall of the groove can be controlled to the desired amounts, respectively.

Figure 10E:
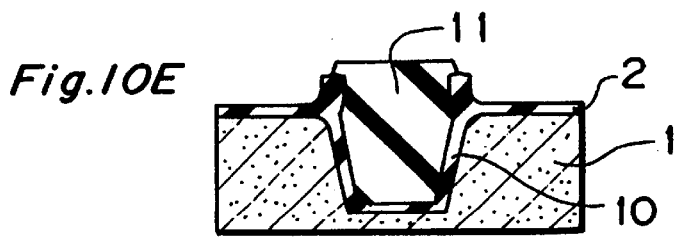

Next, as shown in FIG. 10E, by heated phosphoric acid, a silicon nitride film 3 is removed, and further, the polysilicon film 5 is removed by dry etching step.

Figure 10F:
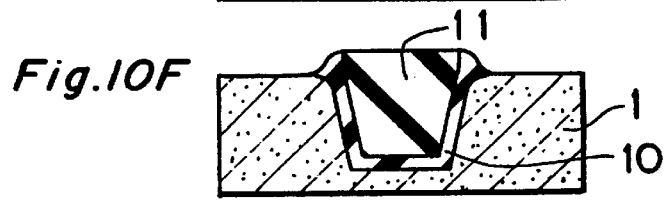

Lastly, as shown in FIG. 10F, the under-laid oxide film 2 is removed by wet etching using hydrofluoric acid to form a trench type element isolation structure.

In this manner, by using a method according to Embodiment 10, it becomes possible to manufacture a trench type element isolation structure having a structure as shown in FIG. 11.

Also, due to the use of a silicon nitride film 3 as a stopper in CMP step, dispersion of the heights of the imbedded oxide film 11 projecting upward from the surface of the silicon substrate 1 can be made small.

Embodiment 11

Figure 12:
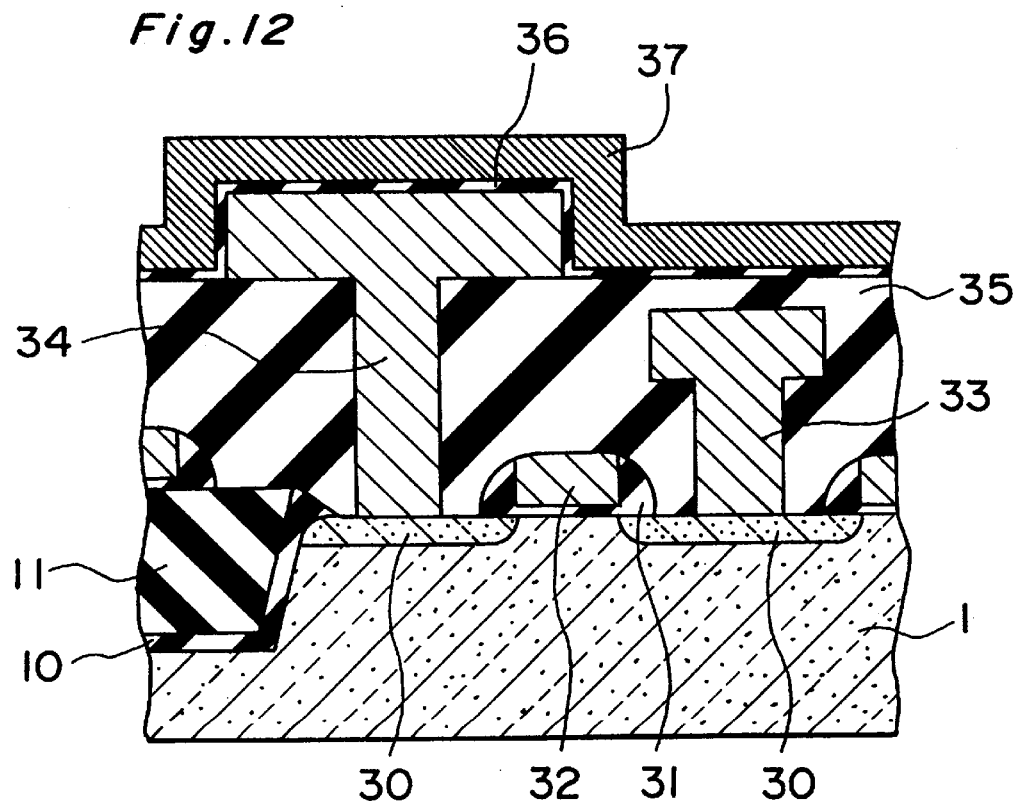
FIG. 12 is a sectional view of a DRAM structure using a trench type element isolation structure according to Embodiment 11 of the present invention.

FIG. 12 shows a sectional view of a DRAM memory cell made by utilizing the trench type element isolation structure according to the present invention.

With respect to the forming method for such DRAM memory cell, first, according to any method of the foregoing Embodiments 1 to 10, a trench type element isolation region is formed.

Next, a p-type well (not illustrated) is formed, after which about 10 nm of gate oxide film is deposited by using a thermal oxidation step, and further about 100 nm of polysilicon film (gate electrode material) is deposited by using a CVD step.

Next, by photolithography, a resist is formed in a predetermined region, and with this used as a mask, a polysilicon film is patterned by anisotropic etching to form a gate electrode 32. Subsequently, the resist is removed.

Next, using a trench isolation film and a gate electrode 32 as mask, by ion implantation method, As is implanted under the implantation conditions of the acceleration voltage of 50 keV, dose amount of $5 \times 10^{13}/cm^2$ to form an n-type layer 30 (S/D region).

Next, by CVD step, an oxide film having a film thickness of about 100 nm is deposited over the whole surface, and by anisotropic etching, a side wall insulating film 31 is formed.

Next, as an inter-layer insulating film 35, by CVD step, an oxide film is accumulated on the whole surface by about 700 nm, after which a bit line contact hole is provided on the predetermined position.

Next, as a bit line wiring material, about 100 nm of polysilicon containing impurities, and further, about 100 nm of tungsten silicide (WSi), are sequentially deposited over the whole surface, after which the wiring is formed by patterning only in the predetermined region to form a bit line 33.

Next, as an inter-layer insulation film 35, there is again deposited by a CVD step about 700 nm of oxide film over the whole surface to provide a storage node contact hole on a predetermined position.

Next, as a lower capacitor electrode material, about 800 nm of polysilicon containing impurities is deposited over the whole surface and the lower capacitor electrode material is disposed only on the predetermined region by patterning to form a storage node 34.

Next, as a capacitor dielectric film, about 7 nm of silicon oxynitride (SiON) film 36 is deposited by CVD step.

Next, as an upper capacitor electrode, by CVD step, about 50 nm of polysilicon containing impurities is deposited to form a cell plate, and polysilicon is provided only on the predetermined region by patterning to form a upper capacitor electrode 37.

By carrying out the above steps, a DRAM memory cell as shown in FIG. 12 is completed.

In such DRAM memory cell, due to the requirement for the integration, a transistor having narrow channel width is used. By using a trench type element isolation structure of the present invention as an element isolation film, it becomes possible to prevent a reverse narrow channel effect even in a transistor having narrow channel width.

As a result, in a DRAM device comprising a large number of memory cells disposed as shown in FIG. 12, dispersion of the element characteristics caused by the dispersion of the channel width on each memory cell is suppressed, so that the stabilized operation of the device and the high yield are attained.

Moreover, by suppressing the generation of the seam by using the forming method according to the present invention, short-circuiting between the adjacent gate electrodes can be prevented.

What is claimed is:

1. A trench type element isolation structure comprising: (a) an imbedded oxide film projecting upward from a silicon substrate surface and being imbedded in a groove formed on said silicon substrate through (b) a thermal oxidation film, said thermal oxidation film comprising:

first thermal oxidation film portion formed higher than said silicon substrate surface; and a second thermal oxidation film portion formed on the surface of said groove lower than said silicon substrate surface, wherein each of the film thicknesses of said first thermal oxidation film and said second thermal oxidation film has an overhang part gradually overhanging outward in the vicinity of said silicon substrate surface, so that the film thicknesses of said second and first thermal oxidation film portions in a direction perpendicular to a wall of said groove are maximized in the vicinity of said silicon substrate surface.

2. A trench type element isolation structure according to claim 1, wherein said film thickness of said first thermal oxidation film portion is thicker than that of said second thermal oxidation film portion.

3. A trench element isolation structure according to claim 1, wherein an upper surface of said imbedded oxide film is covered with the first thermal oxidation film portion.

4. A DRAM memory cell structure comprising a trench type element isolation structure according to claim 1, the DRAM memory cell structure further comprising a plurality of MOS transistors formed on a semiconductor substrate, an insulation film formed on said MOS transistor, and a bit line and a capacitor electrode which are respectively electrically connected with the source region and drain region of the MOS transistor through a contact hole provided on said insulation film, wherein electrical insulation is effected between said plural MOS transistors by the trench type element isolation structure formed on said semiconductor substrate.

* * * * *